United States Patent
Partsch et al.

(12)

(10) Patent No.: US 11,900,984 B2
(45) Date of Patent: Feb. 13, 2024

(54) DATA DESTRUCTION

(71) Applicant: Rambus Inc., San Jose, CA (US)

(72) Inventors: Torsten Partsch, San Jose, CA (US); John Eric Linstadt, Palo Alto, CA (US); Helena Handschuh, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 18/104,069

(22) Filed: Jan. 31, 2023

(65) Prior Publication Data

US 2023/0260564 A1    Aug. 17, 2023

Related U.S. Application Data

(63) Continuation of application No. 17/325,977, filed on May 20, 2021, now Pat. No. 11,600,316.
(Continued)

(51) Int. Cl.
*G11C 7/00* (2006.01)
*G11C 11/406* (2006.01)
(Continued)

(52) U.S. Cl.
CPC .... *G11C 11/40626* (2013.01); *G11C 11/4076* (2013.01); *G11C 11/4085* (2013.01); *G11C 11/4091* (2013.01); *G11C 11/4094* (2013.01)

(58) Field of Classification Search
CPC .......... G11C 11/40626; G11C 11/4076; G11C 11/4085; G11C 11/4091; G11C 11/4094; G11C 11/40611
See application file for complete search history.

(56) References Cited

U.S. PATENT DOCUMENTS 7,164,611 B2 * 1/2007 Kinsley ............... G11C 11/4078
                                                        365/185.04
8,699,263 B2    4/2014 Parris
(Continued)

OTHER PUBLICATIONS

Kim, Jeremie S., et al., "D-RaNGe: Using Commodity DRAM Devices to Generate True Random Numbers with Low Latency and High Throughput", 2019 IEEE International Symposium on High Performance Computer Architecture (HPCA), Feb. 16-20, 2019, Downloaded at: https://people.inf.ethz.ch/ornutlu/pub/drange-dram-latency-based-true-random-number-generator_hpca19.pdf, 14 pages.
(Continued)

*Primary Examiner* — Mushfique Siddique
(74) *Attorney, Agent, or Firm* — The Neudeck Law Firm, LLC

(57) ABSTRACT

A block of dynamic memory in a DRAM device is organized to share a common set of bitlines may be erased/destroyed/randomized by concurrently activating multiple (or all) of the wordlines of the block. The data held in the sense amplifiers and cells of an active wordline may be erased by precharging the sense amplifiers and then writing precharge voltages into the cells of the open row. Rows are selectively configured to either be refreshed or not refreshed. The rows that are not refreshed will, after a time, lose their contents thereby reducing the time interval for attack. An external signal can cause the isolation of a memory device or module and initiation of automatic erasure of the memory contents of the device or module using one of the methods disclosed herein. The trigger for the external signal may be one or more of temperature changes/conditions, loss of power, and/or external commands from a controller.

20 Claims, 27 Drawing Sheets

Related U.S. Application Data

(60) Provisional application No. 63/031,150, filed on May 28, 2020.

(51) Int. Cl.
    *G11C 11/4091*     (2006.01)
    *G11C 11/4076*     (2006.01)
    *G11C 11/4094*     (2006.01)
    *G11C 11/408*     (2006.01)

(56) References Cited

U.S. PATENT DOCUMENTS

| | | |
|---|---|---|
| 9,146,882 B2 | 9/2015 | Franceschini et al. |
| 9,679,632 B2 * | 6/2017 | Mohammad .............. G11C 7/20 |
| 10,665,290 B1 * | 5/2020 | He ..................... G11C 11/40611 |
| 2008/0031067 A1 * | 2/2008 | Lovett .................. G11C 7/1048 |
| | | 365/208 |
| 2008/0094877 A1 | 4/2008 | Schneider |
| 2012/0087176 A1 * | 4/2012 | Behrends ............ G11C 11/4072 |
| | | 365/226 |
| 2012/0278579 A1 * | 11/2012 | Goss .................. G06F 12/0246 |
| | | 711/E12.002 |
| 2013/0332669 A1 * | 12/2013 | Matsumoto ......... G11C 11/4076 |
| | | 711/106 |
| 2016/0118104 A1 * | 4/2016 | Guz .................... G11C 11/4072 |
| | | 365/203 |
| 2016/0211009 A1 * | 7/2016 | Parris .................. G11C 11/4096 |

OTHER PUBLICATIONS

Kirihata, Toshiaki et al., "Flexible Test Mode Approach for 256-Mb DRAM", IEEE Journal of Solid-State Circuits, vol. 32, No. 10, Oct. 1997, pp. 1525-1534. 10 Pages.

Seol, Hoseok et al., "In-DRAM Data Initialization", IEEE Transactions on Very Large Scale Integration (VLSI) Systems, vol. 25, No. 11, Nov. 2017, pp. 3251-3254. 4 Pages.

\* cited by examiner

DATA DESTRUCTION

DETAILED DESCRIPTION OF THE EMBODIMENTS

One of the concerns in computer security is a systems vulnerability to a "cold boot attack." A cold boot attack is a side channel attack where an attacker with physical access to a system is able to obtain a copy of the systems memory. A cold boot attack relies on the fact that the contents of a dynamic random access memory (DRAM) may remain readable for a period of time after power has been removed.

In several embodiments, fast, hardware based, memory erase functions/operations are disclosed. In a first embodiment, a block of dynamic memory organized to share a common set of bitlines may be erased/destroyed/randomized by concurrently activating multiple (or all) of the wordlines of the block. In a second embodiment, the data held in the sense amplifiers and cells of an active wordline is erased by precharging the sense amplifiers and then writing precharge voltages into the cells of the open row. In another embodiment, rows are selectively configured to either be refreshed or not refreshed. The rows that are not refreshed will, after a time, lose their contents thereby reducing the time interval for attack.

In an embodiment, the contents of a memory module may be erased in response to an indicator of an attack. For example, a memory module may detect an impending loss of power or a rapid temperature change. In response, the memory devices on the module may be commanded to quickly erase their contents block by block.

In an embodiment, erased or un-refreshed memory contents may be used as the basis for a physically unclonable function. In an embodiment, erased or un-refreshed memory contents may be used as the basis for a random number generator function.

Figure 1:
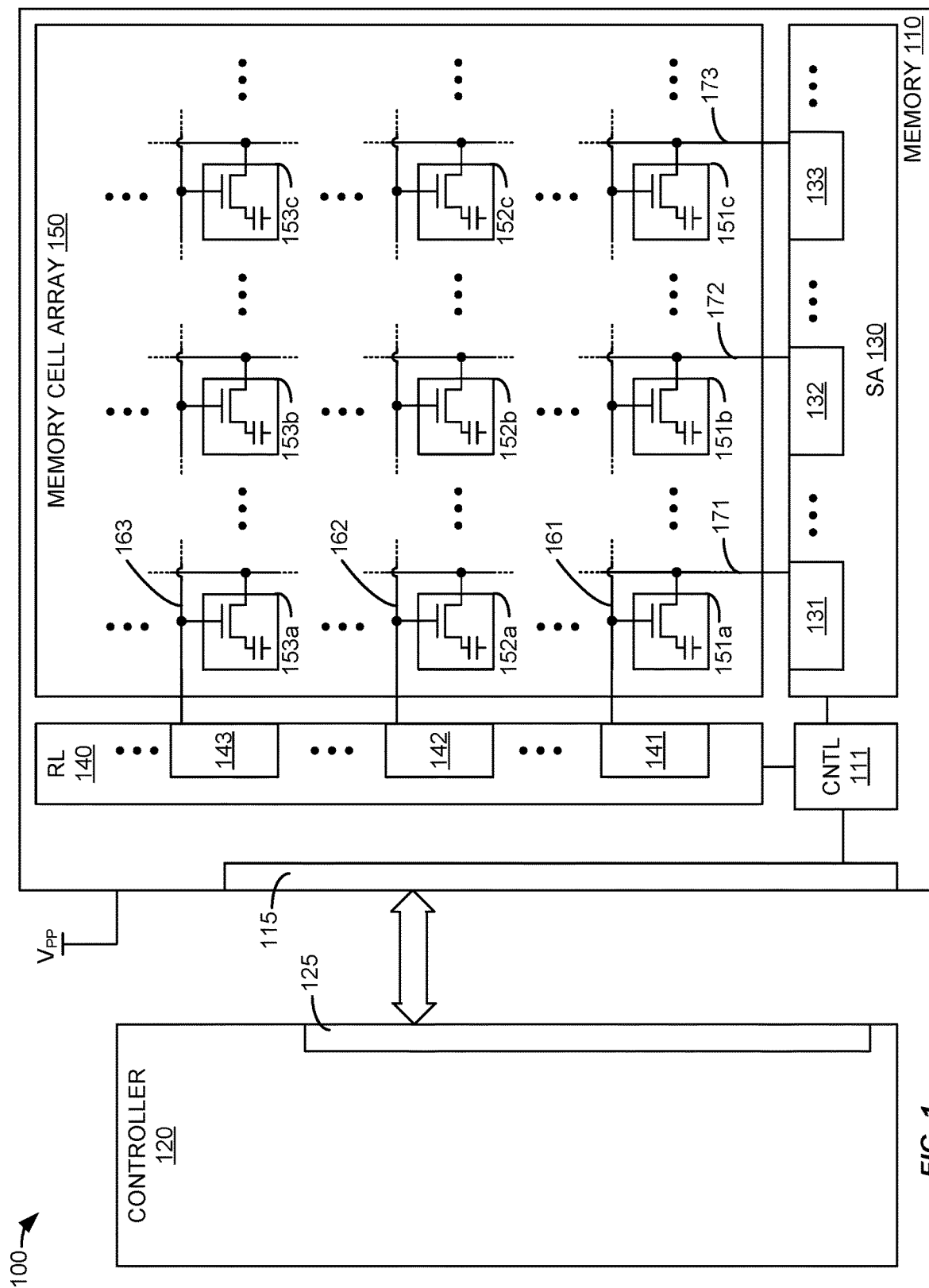
FIG. 1 is a block diagram illustrating a memory system.

FIG. 1 is a block diagram illustrating a memory system. In FIG. 1, memory system 100 includes dynamic random access memory device 110 and controller 120. Controller 120 and memory device 110 are integrated circuit type devices, such as are commonly referred to as "chips". A memory controller, such as controller 120, manages the flow of data going to and from memory devices. A memory controller can be a separate, standalone chip, or integrated into another chip. For example, a memory controller may be included on a single die with a microprocessor, or included as part of a more complex integrated circuit system such as a block of a system on a chip (SOC).

Controller 120 includes physical interface circuitry 125. Physical interface circuitry 125 includes a command/address (CA) interface and a bidirectional data (DQ) interface. Memory device 110 includes physical interface circuitry 115. Interface circuitry 115 includes a command/address (CA) interface and a bidirectional data (DQ) interface. The command/address interface of controller 120 is operatively coupled to CA interface of memory device 110 to send commands and addresses to memory device 110. Controller 120 is operatively coupled to memory device 110 via bidirectional data interface to communicate data with memory device 110.

In FIG. 1, memory device 110 includes multiple banks/sub-banks of memory arrays. These multiple banks/sub-banks include row logic 140, and sense amplifiers 130 coupled to the memory cells 151a-151c, 152a-152c, 153a-153c of a memory cell array 150. Row logic 140 includes wordline drivers 141-143. Sense amplifiers 130 include sense amplifier 131, sense amplifier 132, and sense amplifier 133. In FIG. 1, wordline driver 141 is coupled in the horizontal direction to the control node of memory cells 151a-151c via wordline 161; wordline driver 142 to memory cells 152a-152c via wordline 162; and, wordline driver 143 to memory cells 153a-153c via wordline 163. Sense amplifier 131 is coupled in the vertical direction to memory cells 151a, 152a, and 153a via bitline 171; sense amplifier 132 to memory cells 151b, 152b, and 153b via bitline 172; and, sense amplifier 133 to memory cells 151c, 152c, and 153c via bitline 173. Note that the memory cells 151a-151c, 152a-152c, 153a-153c coupled to wordlines 161-163 of memory cell array 150 share bitlines 171-173.

Memory device 110 also includes control circuitry 111. Control circuitry 111 is operatively coupled to memory cell array 150, row logic 140, and sense amplifiers 130 to process at least column addresses, row addresses, and/or commands received via interface circuitry 115. Memory device 110 may be, be on, or comprise at least one integrated circuit. Sense amplifiers 130 typically include a pair of cross-coupled inverters in a bi-stable flip-flop configuration coupled to respective bitlines 171-173 of memory cell array 150.

In an embodiment, control circuitry 111 receives an indicator to erase a block of memory. For example, an indicator (e.g., command, mode register set, etc.) to erase a block of memory may be received from controller 120 by memory device 110 via interface circuitry 115. In response to the indicator, control circuitry 111 concurrently activates multiple wordlines 161-163 of memory cell array 150. For example, to erase the entire contents of memory cell array 150, control circuitry 111 may concurrently activate all of the wordlines 161-163 of memory cell array 150 that share bitlines 171-173. Concurrently activating a plurality of wordlines 161-163 in order to erase the information stored in the rows associated with the activated wordlines 161-163 may be referred to as a "destructive block activate" and abbreviated with a command pneumonic BACT.

In some embodiments, while wordlines 161-163 are concurrently activated, control circuitry 111 may control sense amplifiers 130 to either: (a) sense and writeback the voltages on bitlines 171-173; (b) remain in precharge actively driving bitlines 171-173 to a precharge voltage level; or, (c) keep sense amplifiers 130 isolated from bitlines 171-173.

In an embodiment where memory device 110 is configured to sense and writeback the voltages on bitlines 171-173 when two or more (or all) wordlines 161-163 are concurrently activated, the individual memory cells 151a-151c, 152a-152c, 153a-153c of the activated rows of memory cell array 150 share (a.k.a., fight) their stored charges on their respective bitlines 171-173. Thus, for any given bitline 171-173, the stored charges from multiple activated cells are shared onto the bitline. In many instances, because some of those stored charges represent 1's and some represent 0's, the value eventually sensed by the sense amplifier (e.g., sense amplifier 131) on a given bitline may have a random characteristic.

In addition, when many or all wordlines 161-163 for the block of memory (e.g., memory cell array 150) that share a set of bitlines 171-173 are concurrently activated, it overloads the boosted wordline voltage supply used by row logic 140 (e.g., $V_{PP}$ or $V_{CCP}$) and the negative substrate bias voltage (e.g., $V_{NWL}$ or $V_{BB}$) supply. When these supplies are overloaded, they are, at first, unable to supply the current needed to maintain their designed voltage levels. Thus, a large number of the memory cell 151a-151c, 152a-152c, 153a-153c transistors conduct at levels lower than when only a single row is activated. The amount each memory cell 151a-151c, 152a-152c, 153a-153c transistor conducts is a physical function influenced by manufacturing variances. Eventually, however, the boosted wordline voltage and the negative substrate bias voltage supplies recover allowing each sense amplifier (and thus the voltage on each bitline 171-173) to settle randomly on a "high" or "low" value. The respective randomized values are written to the active cells on the respective bitline 171-173.

In an embodiment where memory device 110 is configured to remain in precharge and actively drive bitlines 171-173 to a precharge voltage level (e.g., $V_{CC}/2$) when two or more (or all) wordlines 161-163 are concurrently activated, the individual memory cells 151a-151c, 152a-152c, 153a-153c of the activated rows of memory cell array 150 are eventually charged by the precharge circuitry of sense amplifiers 130 to the precharge voltage—thereby losing the information stored by the memory cells 151a-151c, 152a-152c, 153a-153c of the activated rows.

In an embodiment where memory device 110 is configured to keep sense amplifiers 130 isolated from bitlines 171-173 when two or more (or all) wordlines 161-163 are concurrently activated, the individual memory cells 151a-151c, 152a-152c, 153a-153c of the activated rows of memory cell array 150 share (a.k.a., fight) their stored charges on their respective bitlines 171-173. Thus, for each bitline 171-173, the stored charges from multiple activated memory cells 151a-151c, 152a-152c, 153a-153c are shared onto their respective bitlines. In many instances, because some of those stored charges represent 1's and some represent 0's, the voltage level each activated memory cell 151a-151c, 152a-152c, 153a-153 charges to depends on the contents of every activated memory cell 151a-151c, 152a-152c, 153a-153 on the same bitline. Thus, depending on the data being erased, the voltage in the memory cells 151a-151c, 152a-152c, 153a-153c settle to levels that may exhibit random characteristics.

Figure 2:
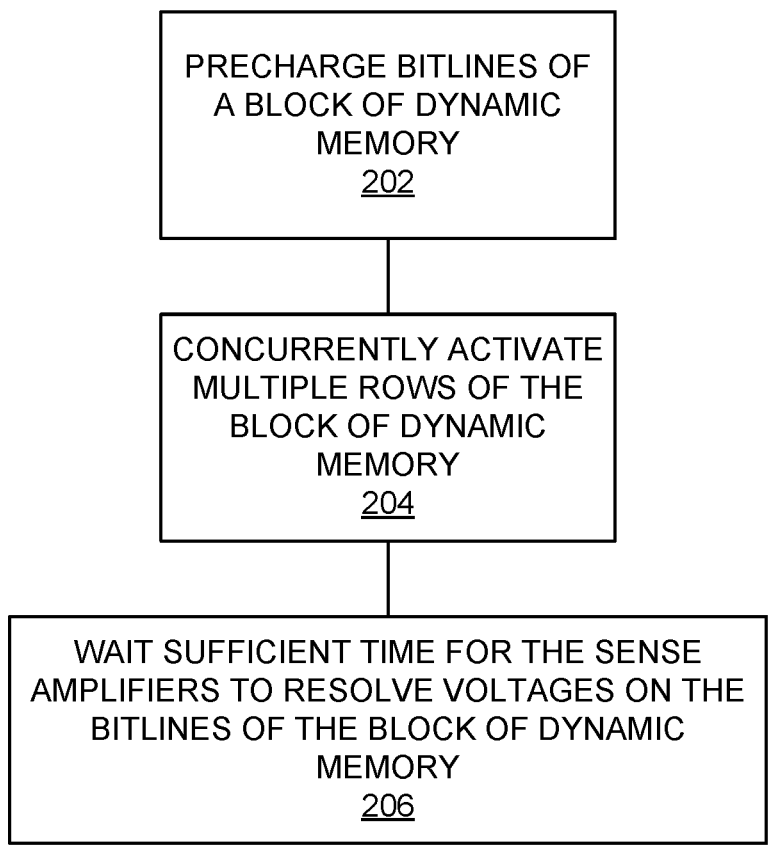
FIGS. 2-4 are flowcharts illustrating example methods of destroying data in a block of memory.

FIG. 2 is a flowchart illustrating an example method of destroying data in a block of memory. One or more steps illustrated in FIG. 2 may be performed by, for example, memory system 100 and/or its components. The bitlines of a block of dynamic memory are precharged (202). For example, memory device 110 may control sense amplifiers 130 to precharge bitlines 171-173 that are in common with the block of memory (e.g., memory array tile—MAT) activated by wordlines 161-163.

Multiple rows of the block of dynamic memory are concurrently activated (204). For example, memory device 110 may control row logic 140 to concurrently activate all of the wordlines 161-163 in memory cell array 150.

A sufficient time for the sense amplifiers to resolve voltages on the bitlines of the block of dynamic memory is waited (206). For example, memory device 110 may control sense amplifiers 130 to sense the voltages on bitlines 171-173 while all of the wordlines 161-163 of memory cell array 150 are activated. When many or all wordlines 161-163 of memory cell array 150 are concurrently activated, the boosted wordline voltage supply used by row logic 140 (e.g., $V_{PP}$ or $V_{CCP}$) and the negative substrate bias voltage (e.g., $V_{NWL}$ or $V_{BB}$) supply may become overloaded such that they are, at first, unable to supply the current needed to maintain their designed voltage levels. Thus, a large number of the memory cell 151a-151c, 152a-152c, 153a-153c transistors conduct at levels lower than the cases where only a single row is activated. The amount each respective memory cell 151a-151c, 152a-152c, 153a-153c transistor conducts is a physical function influenced by manufacturing variances. After a sufficient time, however, the boosted wordline voltage and the negative substrate bias voltage supplies recover allowing each sense amplifier (and thus the voltage on each bitline 171-173) to settle randomly on a "high" or "low" value. The respective randomized values are written to the active cells on the respective bitlines 171-173.

Figure 3:
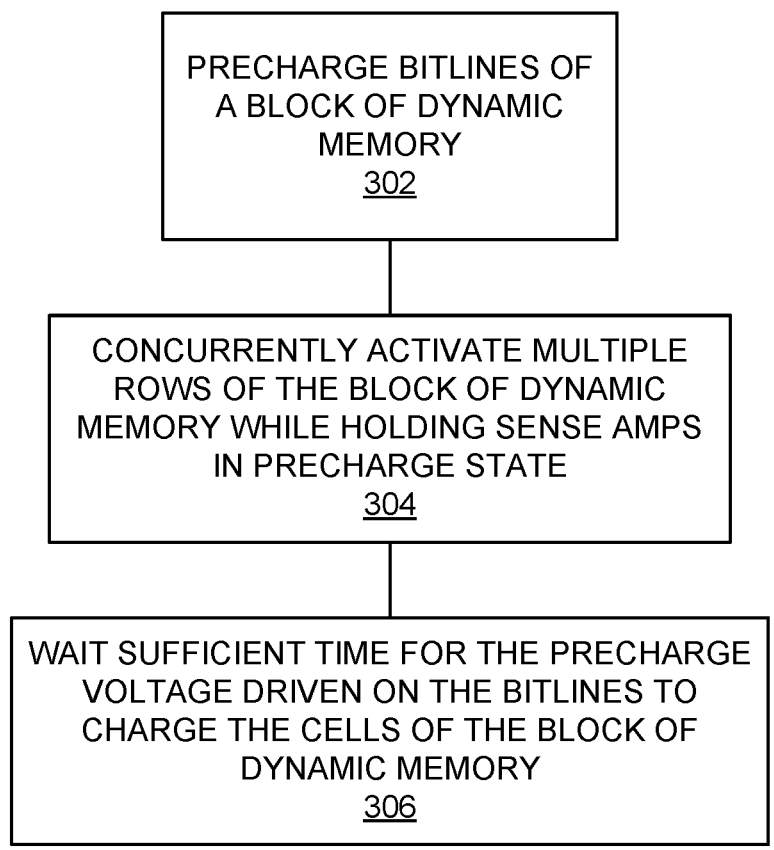

FIG. 3 is a flowchart illustrating an example method of destroying data in a block of memory. One or more steps illustrated in FIG. 3 may be performed by, for example, memory system 100 and/or its components. The bitlines of a block of dynamic memory are precharged (302). For example, memory device 110 may control sense amplifiers 130 to precharge bitlines 171-173 that are in common with the block of memory (e.g., memory array tile—MAT) activated by wordlines 161-163.

Multiple rows of the block of dynamic memory are concurrently activated while the sense amplifiers are held in a precharge state (304). For example, memory device 110 may control row logic 140 to concurrently activate all of the wordlines 161-163 in memory cell array 150 while concurrently controlling sense amplifiers 130 to precharge bitlines 171-173.

A sufficient time for the precharge voltage driven on the bitlines to charge the cells of the block of dynamic memory is waited (306). For example, while wordlines 161-163 are activated, memory device 110 may control sense amplifiers 130 to remain in a precharge state and actively drive bitlines 171-173 to a precharge voltage level (e.g., $V_{CC}/2$). With sense amplifiers 130 actively driving bitlines 171-173 to a precharge voltage while wordlines 161-163 are activated, the transistors of memory cells 151a-151c, 152a-152c, 153a-153c are conducting. This charges the capacitors of memory cells 151a-151c, 152a-152c, 153a-153c to the precharge voltage—thereby erasing the information stored in the capacitors of memory cells 151a-151c, 152a-152c, 153a-153c.

Figure 4:
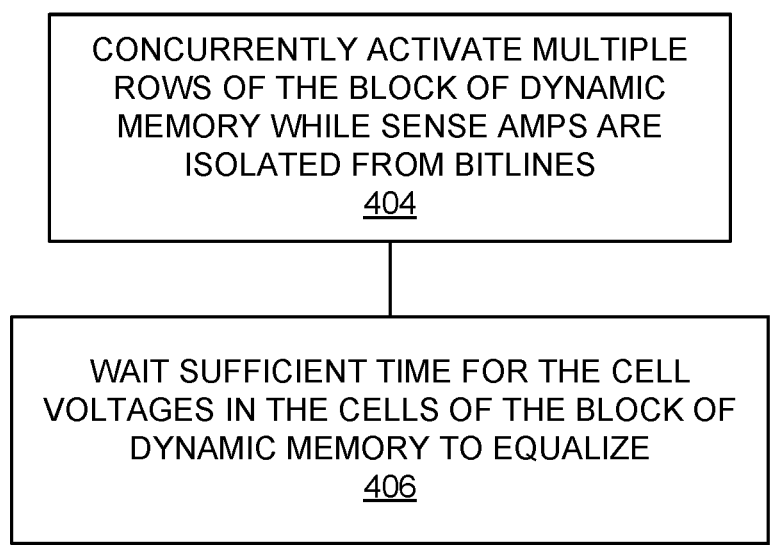

FIG. 4 is a flowchart illustrating an example method of destroying data in a block of memory. One or more steps illustrated in FIG. 4 may be performed by, for example, memory system 100 and/or its components. Multiple rows of the block of dynamic memory are concurrently activated while the sense amplifiers are isolated from the bitlines (404). For example, memory device 110 may control row logic 140 to concurrently activate all of the wordlines 161-163 in memory cell array 150 while concurrently controlling sense amplifiers 130 to be isolated from bitlines 171-173. Memory device 110 may control row logic 140 to concurrently activate all of the wordlines 161-163 in memory cell array 150 after first precharging bitlines 171-173 and then isolating sense amplifiers 130 from bitlines 171-173. In another example, memory device 110 may control row logic 140 to concurrently activate all of the wordlines 161-163 in memory cell array 150 without first precharging bitlines 171-173.

A sufficient time for the cell voltages in the cells of the block of dynamic memory to equalize is waited (406). For example, when two or more (or all) wordlines 161-163 are concurrently activated, the individual memory cells 151a-151c, 152a-152c, 153a-153c of the activated rows of memory cell array 150 share their stored charges on their respective bitlines 171-173. While wordlines 161-163 are activated, the transistors of memory cells 151a-151c, 152a-152c, 153a-153c are conducting, the charges from the capacitors of memory cells 151a-151c, 152a-152c, 153a-153c are shared with respective bitlines 171-173 and each other—thereby erasing the information stored in the capacitors of memory cells 151a-151c, 152a-152c, 153a-153c.

Figure 5:
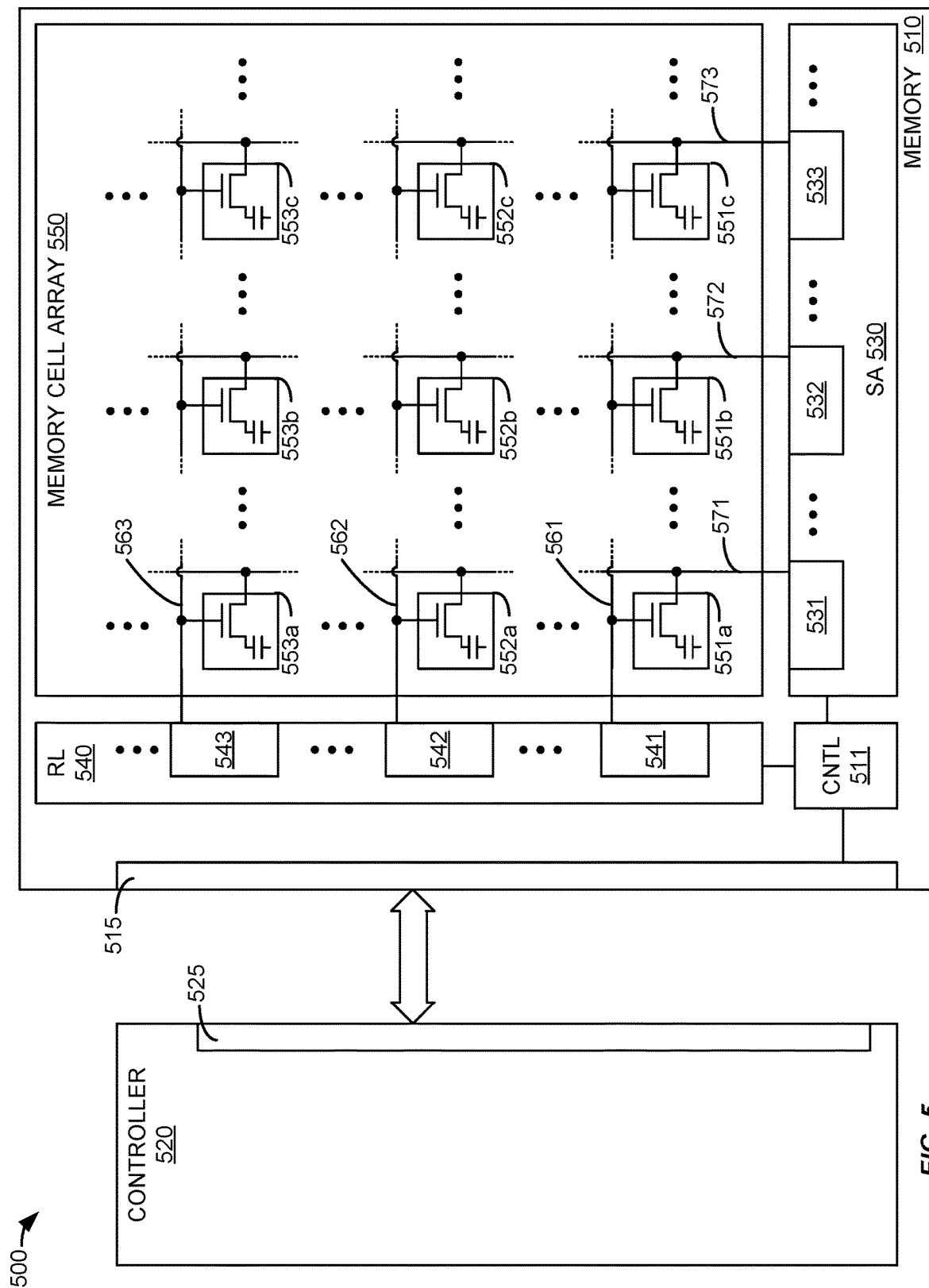
FIG. 5 is a block diagram illustrating a memory system.

FIG. 5 is a block diagram illustrating a memory system. In FIG. 5, memory system 500 includes dynamic random access memory device 510 and controller 520. Controller 520 and memory device 510 are integrated circuit type devices, such as are commonly referred to as "chips". A memory controller, such as controller 520, manages the flow of data going to and from memory devices. A memory controller can be a separate, standalone chip, or integrated into another chip. For example, a memory controller may be included on a single die with a microprocessor, or included as part of a more complex integrated circuit system such as a block of a system on a chip (SOC).

Controller 520 includes physical interface 525. Physical interface 525 includes a command/address (CA) interface and a bidirectional data (DQ) interface. Memory device 510 includes physical interface circuitry 515. Interface circuitry 515 includes a command/address (CA) interface and a bidirectional data (DQ) interface. The command/address interface of controller 520 is operatively coupled to CA interface of memory device 510 to send commands and addresses to memory device 510. Controller 520 is operatively coupled to memory device 510 via bidirectional data interface to communicate data with memory device 510.

In FIG. 5, memory device 510 includes multiple banks/sub-banks of memory arrays. These multiple banks/sub-banks include row logic 540, and sense amplifiers 530 coupled to the memory cells 551a-551c, 552a-552c, 553a-553c of a memory cell array 550. Row logic 540 includes wordline drivers 541-543. Sense amplifiers 530 include sense amplifier 531, sense amplifier 532, and sense amplifier 533. In FIG. 5, wordline driver 541 is coupled in the horizontal direction to the control node of memory cells 551a-551c via wordline 561; wordline driver 542 to memory cells 552a-552c via wordline 562; and, wordline driver 543 to memory cells 553a-553c via wordline 563. Sense amplifier 531 is coupled in the vertical direction to memory cells 551a, 552a, and 553a via bitline 571; sense amplifier 532 is coupled to memory cells 551b, 552b, and 553b via bitline 572; and, sense amplifier 533 is coupled to memory cells 551c, 552c, and 553c via bitline 573.

Memory device 510 also includes control circuitry 511. Control circuitry 511 is operatively coupled to memory cell array 550, row logic 540, and sense amplifiers 530 to process at least column addresses, row addresses, and/or commands received via interface circuitry 515. Memory device 510 may be, be on, or comprise at least one integrated circuit. Sense amplifiers 530 typically include a pair of cross-coupled inverters in a bi-stable flip-flop configuration coupled to respective bitlines 571-573 of memory cell array 550.

In an embodiment, control circuitry 511 receives an indicator to erase data stored in the sense amplifiers 530 and a row of memory cell array 550. For example, an indicator (e.g., command, mode register set, etc.) to erase a row (e.g., 552a-552c) of memory may be received from controller 520 by memory device 510 via interface circuitry 515. In an embodiment, the indicator can be encoded in an unused address bit of a command. For example, one or more unused address bits of the Precharge (PRE) or Read with Auto-Precharge (RDA) commands may be used to supply the indicator to erase data stored in the sense amplifiers. In response to the indicator, control circuitry 511 equalizes (precharges) sense amplifiers 530 while a wordline 561-563 is activated. This causes the cross-coupled inverters in each sense amplifier to lose the state (data) that they were in. Precharging sense amplifiers 530 while a wordline 561-563 is activated also overwrites the values in the storage capacitors of the active row thereby causing the information stored by those cells to be lost. This "destructive precharge" method avoids a timing, energy, or cycle overhead required to overwrite the data in the row using individual write commands. It should also be understood that performing this destructive precharge after the final read access to the row rather than a non-destructive (i.e., normal) precharge has no timing penalty. In other words, the command to "next" command interval following a destructive precharge can be the same as the command to "next" command interval following a 'normal' precharge.

In some embodiments, memory system 500 may also include circuitry described with reference to memory system 100, and/or be configured to perform one or more, or all of the functions described herein with reference to FIGS. 1-4, and vice versa. For example, system 500 may also be implemented to perform all or parts of the described destructive block activate functionality. Likewise, system 100 may be implemented to perform all or parts of the described destructive precharge functionality.

Figure 6:
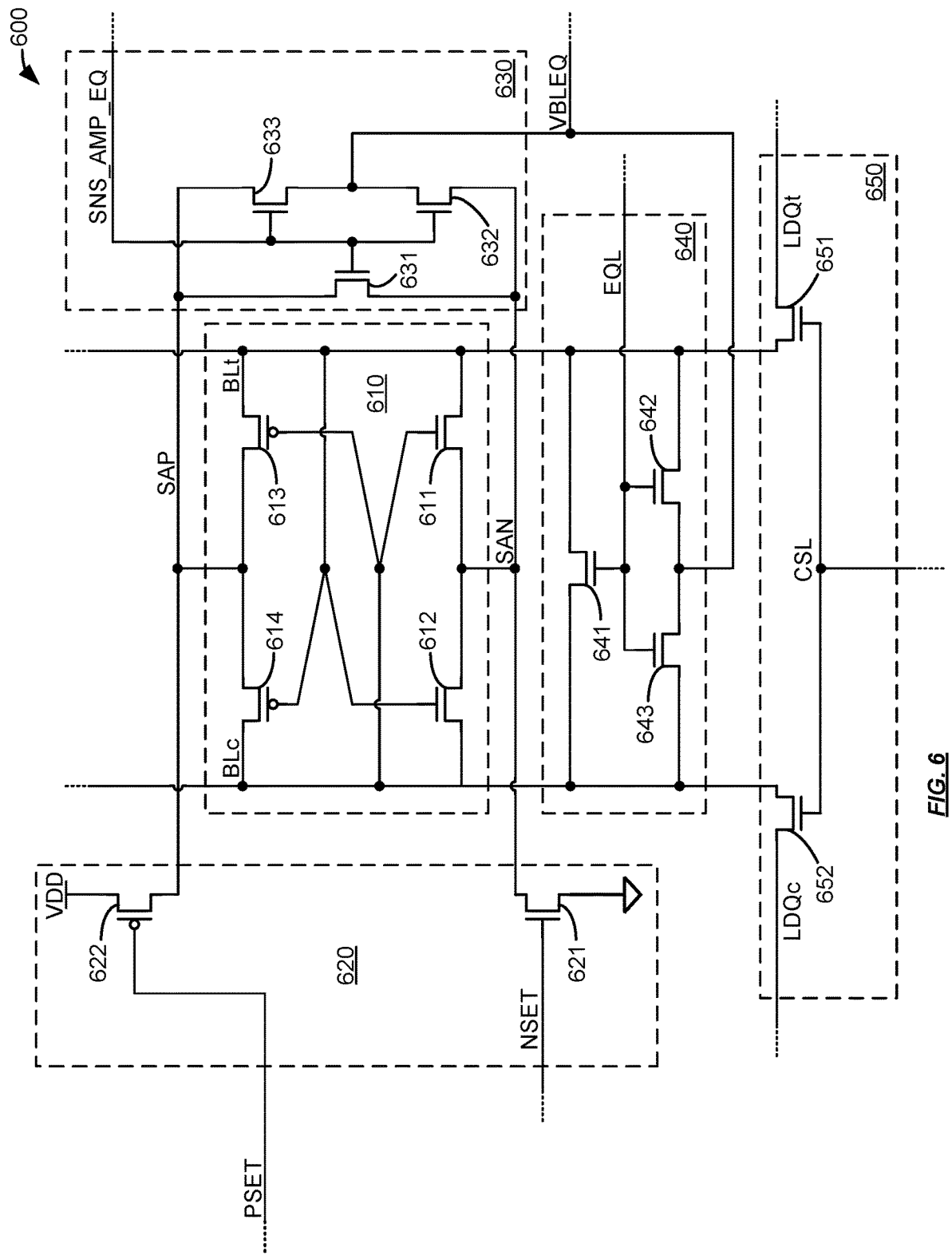
FIG. 6 is a diagram illustrating an example sense amplifier.

FIG. 6 is a diagram illustrating an example sense amplifier. Sense amplifier 600 may be part of memory device 110, memory device 510, and/or striped sense amplifiers 530 (i.e., as sense amplifiers 531-533, in particular.) In FIG. 6, sense amplifier 600 includes functional blocks 610, 620, 630, 640, and 650. Sense amplifier 600 performs the evaluation of the voltage difference on the true (BLt) and complement (BLc) bitlines.

Amplifier block 610 is comprised of a pair of cross-coupled inverters that are switched on by evaluate control block 620. The cross-coupled inverters of amplifier block 610 comprise n-channel field effect transistors (NFETs) 611 and 612, and p-channel field effect transistors (PFETs) 613 and 614. NFET 611 and PFET 613 form a first inverter that is cross-coupled to a second inverter formed using NFET 612 and PFET 614. The output of each inverter is provided to the input of the other inverter (i.e., cross-coupled). The negative supply and the positive supply to the inverters of amplifier block 610 are selectively provided by evaluate control block 620.

The power supplies SAN and SAP to these inverters are selectively (switchably) provided to amplifier block 610 by evaluate control block 620 in order to allow the internal and external nodes of/to amplifier block 610 (including the bitlines BLt and BLc, and power supplies SAN and SAP) to be equalized and then to be activated to evaluate the voltages on the bitlines BLt and BLc. The power supplies SAN and SAP to these inverters are also selectively (switchably) removed from to amplifier block 610 by evaluate control block 620 in order to allow the internal and external nodes of/to amplifier block 610 (including the bitlines BLt and BLc, and power supplies SAN and SAP) to be equalized while a wordline is activated thereby erasing the data in sense amplifier 600 and the activated row.

Evaluate control block 620 includes NFET 621 and PFET 622. NFET 621, under the control of the signal on the NSET node, switchably connects and disconnects the negative (reference) supply voltage to the node SAN (which is the negative supply for amplifier block 610). PFET 622, under the control of the signal on the PSET node, switchably connects and disconnects the positive supply voltage to the node SAP (which is the positive supply for amplifier block 610).

Sense amplifier equalize block 630, when activated via a signal on node SNS_AMP_EQ (e.g., from control circuitry 511) connects SAP and SAN together and to an equalize supply voltage VBLEQ. This causes amplifier block 610 to lose its state (data). Sense amplifier equalize block 630 includes NFETs 631-633. The gates of NFETs 631-633 are operatively coupled together and to node SNS_AMP_EQ. The source and drain nodes of NFET 631 are connected to SAN and SAP, respectively. The source and drain nodes of NFET 632 are connected to SAN and VBLEQ, respectively. The source and drain nodes of NFET 633 are connected to VBLEQ and SAP, respectively.

Bitline equalize block 640, when activated via a signal on node EQL, connects the bitlines BLt and BLc together and to an equalize supply voltage VBLEQ. Bitline equalize block 640 includes NFETs 641-643. The gates of NFETs 641-643 are operatively coupled together and to node EQL. The source and drain nodes of NFET 641 are connected to BLt and BLc, respectively. The source and drain nodes of NFET 642 are connected to BLt and VBLEQ, respectively. The source and drain nodes of NFET 643 are connected to VBLEQ and BLc, respectively. When bitline equalize block 640 is activated while a wordline is activated, the information stored by the cells of the active row is overwritten by charging the storage capacitors of those cells to the voltage VBLEQ.

Figure 7A:
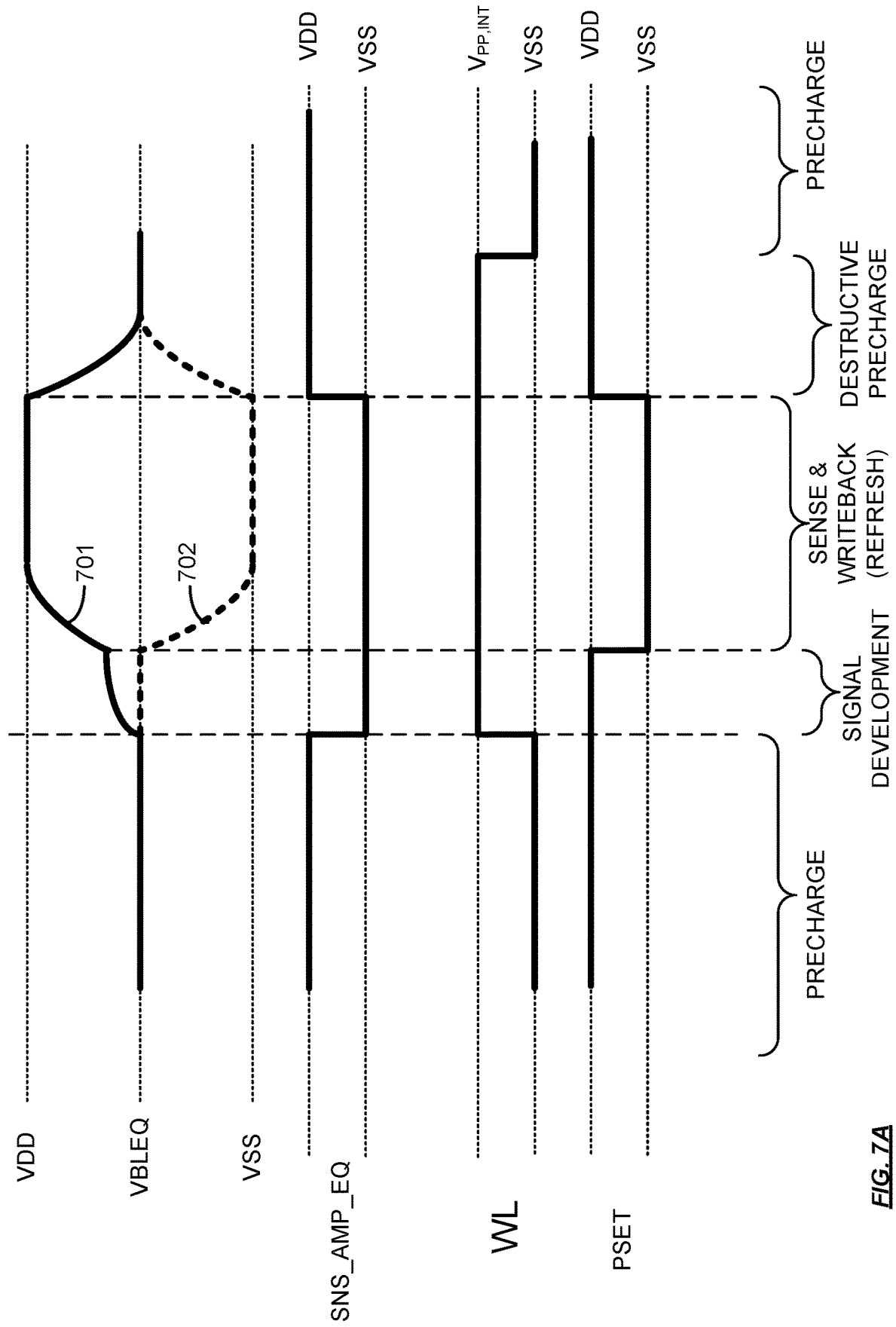
FIG. 7A is a diagram that illustrates a destructive precharge operation.

FIG. 7A is a diagram that illustrates a destructive precharge operation. In FIG. 7A, a sense (read) operation is performed followed by a destructive precharge operation. In FIG. 7A, waveforms 701 and 702 represent the voltages on bitlines (e.g., bitlines BLt and BLc of sense amplifier 600.) In a first phase (precharge state) the waveforms 701-702 illustrate the bitlines are precharged to the same voltage level VBLEQ. VBLEQ may, in some embodiments, be approximately equal to VDD/2. During this first precharge phase, SNS_AMP_EQ is driven to the positive supply voltage (e.g., VDD or VBLH) while the wordlines are held at the negative supply voltage (e.g., VSS.) This is to allow the bitlines to be charged to VBLEQ in a (non-destructive) precharge state.

The next (second) phase is signal development. Signal development is started when the equalization circuitry (e.g., sense amplifier equalize block 630, and bitline equalize block 640) are turned off and the addressed wordline is driven to the boosted wordline voltage $V_{PP,int}$. This activates the row coupled to the (now active) wordline while the sense-amp is not yet switched to sense. Signal development shares the charge of the cell with the bitline and separates true and complement bitline slightly to have a signal that is then amplified in the sense phase.

In a third phase (sense operation), PSET is driven to the negative reference voltage VSS. When PSET is driven to the negative reference voltage, the positive supply node SAP of the amplifier block (e.g., amplifier block 210) of the sense amplifier is connected to VDD. This, along with the negative node being connected to VSS (via the assertion of NSET—not shown in FIG. 7A) causes the cross-coupled inverters (e.g., amplifier block 610) of the sense amplifier to evaluate the voltage difference on the bitlines. As the voltage difference is evaluated, the cross-coupled inverters feedback with each other to drive the bitlines according to the voltage difference on the bitlines. This is illustrated in FIG. 7A by waveform 701 charging up to VDD and waveform 702 discharging to VSS.

In a fourth phase (destructive precharge operation), PSET and SNS_AMP_EQ are driven to VDD while the wordline remains at $V_{PP,int}$. This allows the bitlines and the cells of the open row to be charged to the voltage level VBLEQ. This is illustrated in FIG. 7A by the waveforms 701-702 returning to VBLEQ. In a fifth phase, the wordline is driven to VSS in order to deactivate the row that has been erased.

Figure 7B:
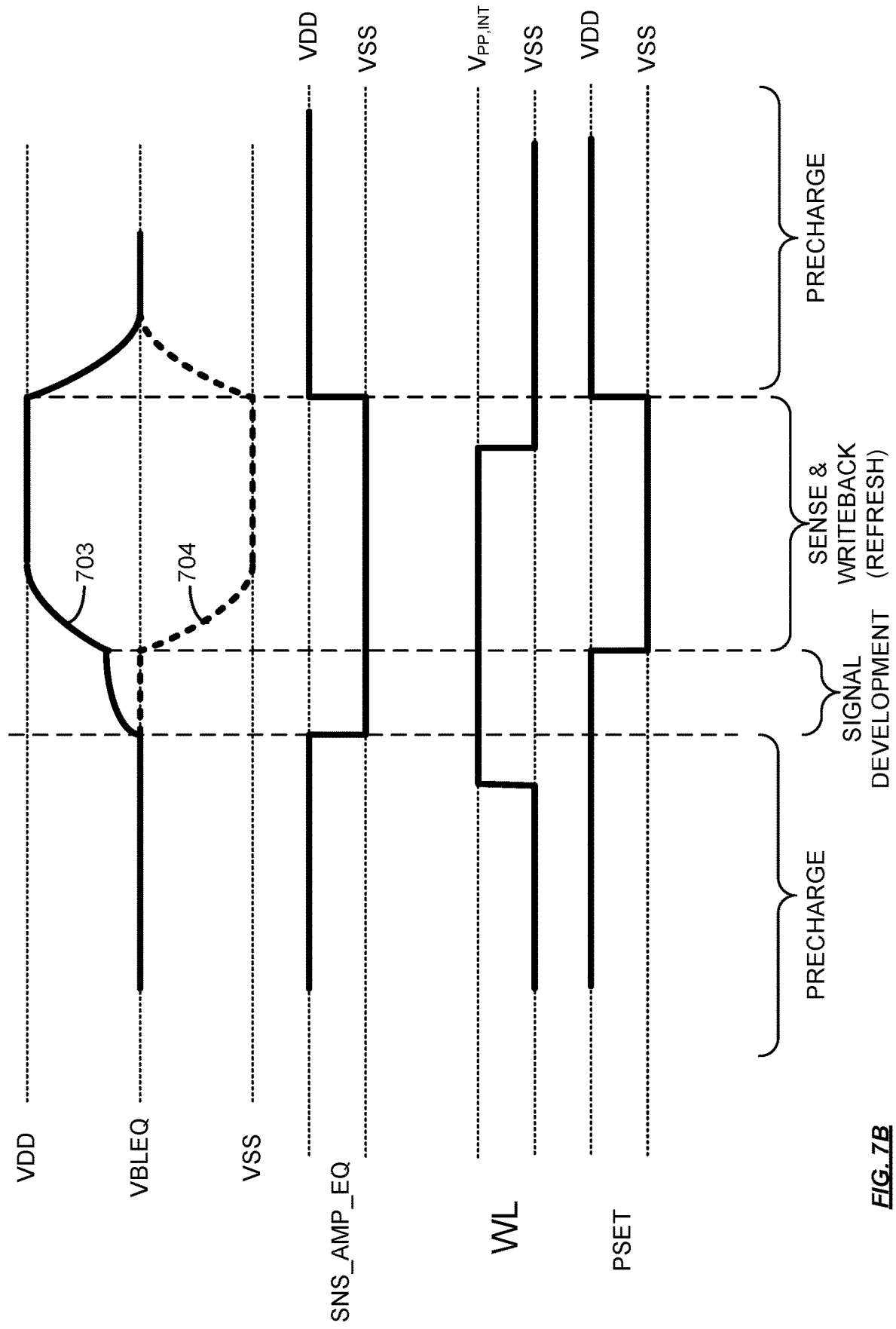
FIG. 7B is a diagram that illustrates a non-destructive precharge operation.

FIG. 7B is a diagram that illustrates a non-destructive precharge operation. The non-destructive precharge illustrated in FIG. 7B may be performed by the same circuitry (i.e., sense amplifiers) that perform the destructive precharge illustrated in FIG. 7A. In FIG. 7B, waveforms 703 and 704 represent the voltages on bitlines (e.g., bitlines BLt and BLc of sense amplifier 600.) In a first phase (precharge state) the waveforms 703-704 illustrate the bitlines are precharged to the same voltage level VBLEQ. VBLEQ may, in some embodiments, be approximately equal to VDD/2. During this first precharge phase, SNS_AMP_EQ is driven to VDD while the wordlines are held at VSS. This is to allow the bitlines to be charged to VBLEQ in a precharge state.

The next (second) phase is signal development. Signal development is started when the equalization circuitry (e.g., sense amplifier equalize block 630, and bitline equalize block 640) are turned off and the addressed wordline is driven to the boosted wordline voltage $V_{PP,int}$. This activates the row coupled to the (now active) wordline while the sense-amp is not yet switched to sense. Signal development shares the charge of the cell with the bitline and separates true and complement bitline slightly to have a signal that is then amplified in the sense phase.

In a third phase (sense operation), PSET is driven to the negative reference voltage VSS. When PSET is driven to the negative reference voltage, the positive supply node SAP of the amplifier block (e.g., amplifier block 210) of the sense amplifier is connected to VDD. This, along with the negative node being connected to VSS (via the assertion of NSET—not shown in FIG. 7B) causes the cross-coupled inverters (e.g., amplifier block 610) of the sense amplifier to evaluate the voltage difference on the bitlines. As the voltage difference is evaluated, the cross-coupled inverters feedback with each other to drive the bitlines according to the voltage difference on the bitlines. This is illustrated in FIG. 7B by waveform 703 charging up to VDD and waveform 704 discharging to VSS.

Figure 8:
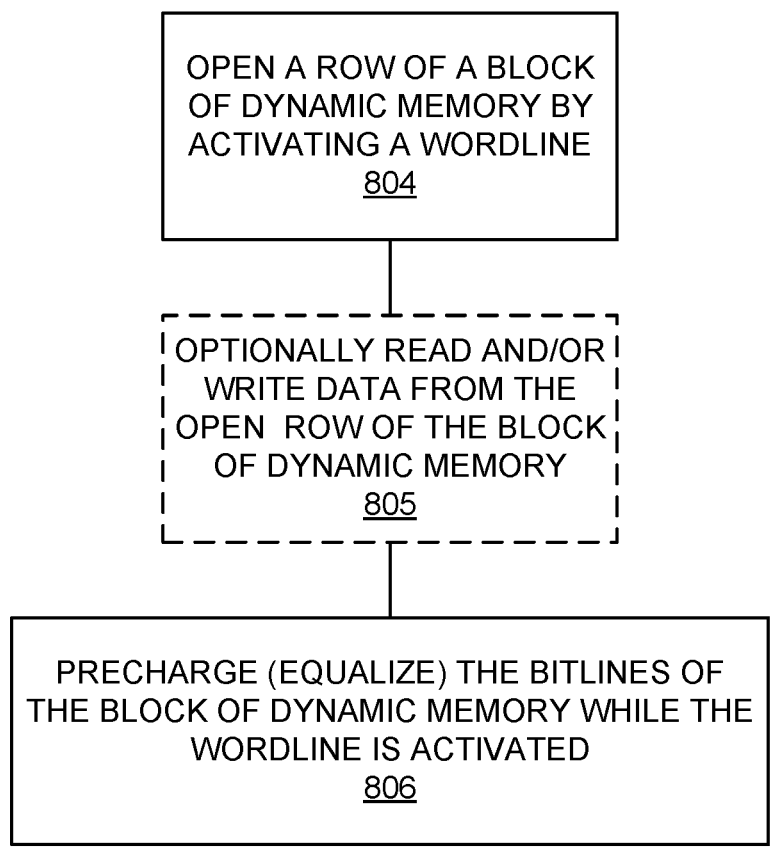
FIGS. 8-9 are flowcharts illustrating example destructive precharge operations.

In a fourth phase (non-destructive precharge operation), the wordline is driven to VSS. A short time later, PSET and SNS_AMP_EQ are driven to VDD. Driving the wordline to VSS closes the open row thereby preventing the bitlines and the cells of the previously open row to be charged to the voltage level VBLEQ. This is illustrated in FIG. 7B by the waveforms 703-704 returning to VBLEQ while the wordline is being driven to VSS FIG. 8 is a flowchart illustrating an example destructive precharge operation. One or more steps illustrated in FIG. 8 may be performed by, for example, memory system 500 and/or its components. A row of a block of dynamic memory is opened by activating a wordline (804). For example, control circuitry 511 may open a row of memory cell array 550 by activating wordline 562.

Optionally, data is read and/or written from the open row of the block of dynamic memory (805). For example, while wordline 562 is activated, control circuitry 511 may control one or more sense amplifiers 530 to provide data to, or receive data from, interface 515 as part of one or more read or write operations, respectively.

The bitlines of the block of dynamic memory are precharged while the wordline is activated (806). For example, for a period of time while wordline 562 is activated, control circuitry 511 may assert a signal (e.g., SNS_AMP_EQ) that results in sense amplifiers 530 equalizing bitlines 571-573 thereby erasing the information in sense amplifiers 530 and the cells of the open row.

Figure 9:
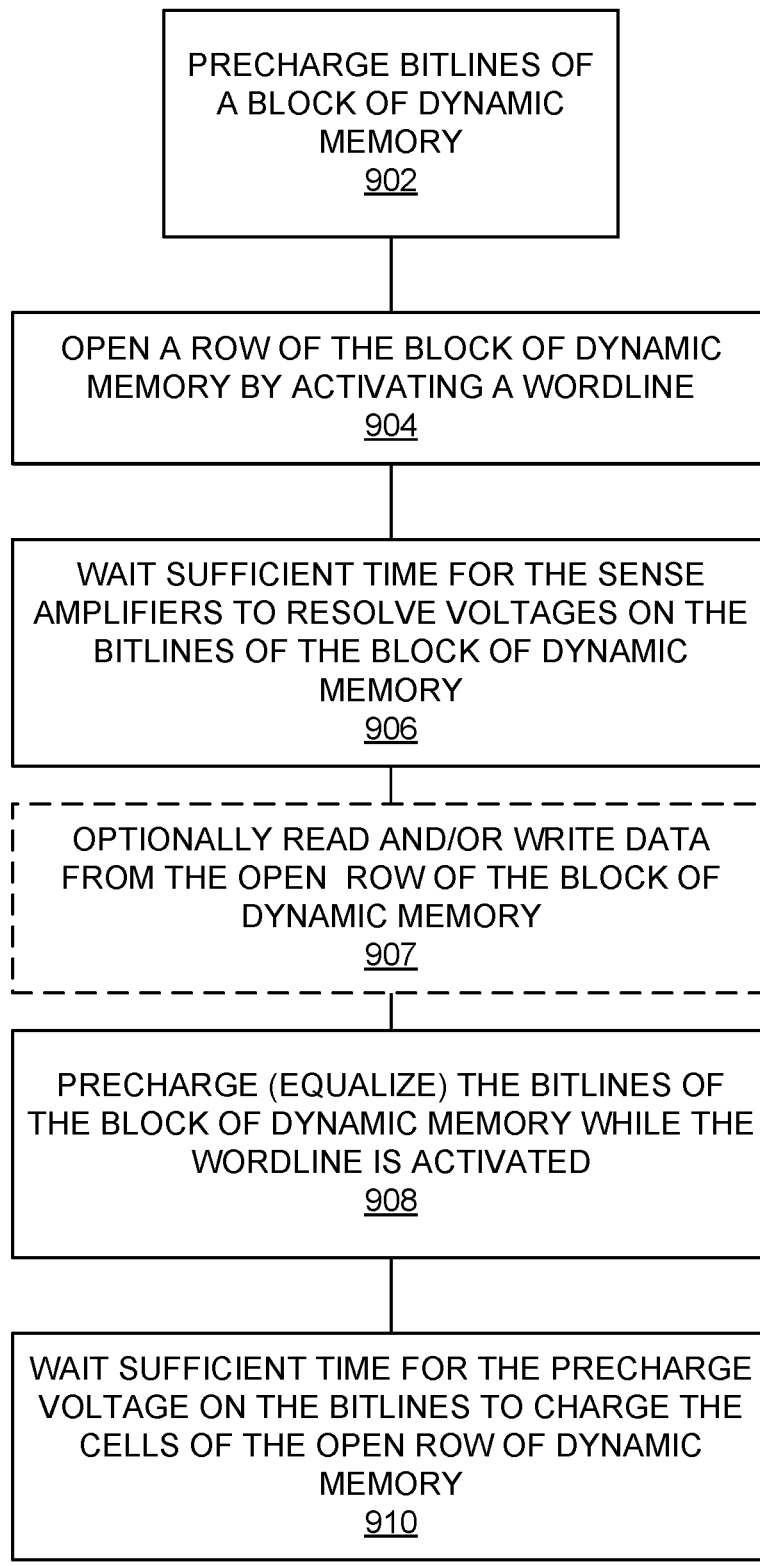

FIG. 9 is a flowchart illustrating an example destructive precharge operation. One or more steps illustrated in FIG. 9 may be performed by, for example, memory system 500 and/or its components. The bitlines of a block of dynamic memory are precharged (902). For example, sense amplifiers 530 may precharge bitlines 571-573 by asserting SNS_AMP_EQ.

A row of the block of dynamic memory is opened by activating a wordline (904). For example, row logic 540 may activate wordline 562 by driving wordline 562 to the boosted wordline voltage $V_{PP,int}$. A sufficient time is waited for the sense amplifiers to resolve voltages on the bitlines of the block of dynamic memory (906). For example, the cross-coupled inverters of sense amplifiers 530 evaluate the voltage difference on the bitlines 571-573 feeding back with each other to drive the bitlines 571-573 according to the voltage difference on the bitlines 571-573.

Optionally, data is read and/or written from the open row of the block of dynamic memory (907). For example, while wordline 562 is driven to the boosted wordline voltage $V_{PP,int}$, control circuitry 511 may control one or more sense amplifiers 530 to provide data to, or receive data from, interface 515 as part of one or more read or write operations, respectively.

The bitlines of the block of dynamic memory are precharged by asserting SNS_AMP_EQ while the wordline is activated (908). For example, while the wordline 562 remains at $V_{PP,int}$, the bitlines 571-573 of the open row may be driven by sense amplifiers 530. A sufficient time is waited for the precharge voltage on the bitlines to charge the cells of the open row of dynamic memory (910). For example, while the wordline 562 is held at $V_{PP,int}$, the bitlines 571-573 and the cells 552a-552c of the open row may be driven to VBLEQ by sense amplifiers 530 thereby erasing the information in sense amplifiers 530 and the cells 552a-552c of the open row.

Figure 10:
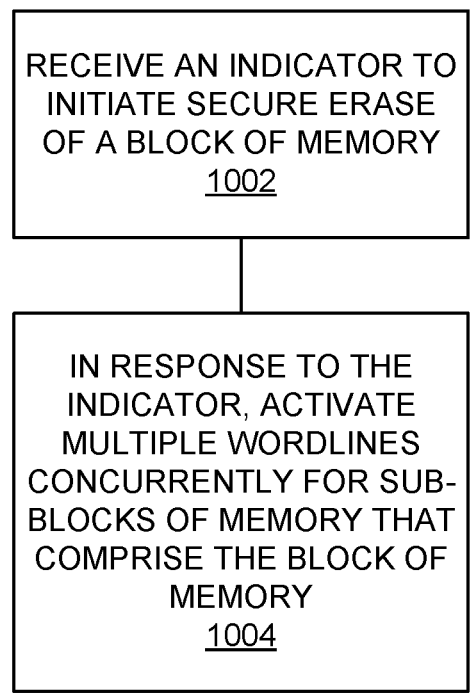
FIGS. 10-11 are flowcharts illustrating example memory erasure operations.

FIG. 10 is a flowchart illustrating example memory erasure operations. One or more steps illustrated in FIG. 10 may be performed by, for example, memory system 100 and/or its components. An indicator to initiate a secure erase of a block of memory is received (1002). For example, memory device 110 may receive a command from controller 120 to erase all or part (e.g., bank) of its contents. In another example, memory device 110 may receive, from controller 120, a series of consecutive commands (e.g., three or more consecutive mode register set commands) that indicate to memory device 110 that memory device 110 is to erase all or part of its contents. In another example, a voltage level or other signal on a pin (analogous to a reset signal) may be received by memory device 110 that indicate to memory device 110 that memory device 110 is to erase all or part of its contents. In another example, memory device 110 may detect a temperature change (and a rapid cooling, in particular) that indicates to memory device 110 that memory device 110 is to erase all or part of its contents. In another example, memory device 110 may detect that memory device 110 is being powered-up and this condition indicates to memory device 110 that memory device 110 is to erase all or part of its contents.

In response to receiving the indicator to erase the block of memory, multiple (or all) wordlines are activated concurrently for sub-blocks of memory that comprise the block of memory (1004). For example, in response to receiving an indicator to erase the entire contents of memory device 110, memory device 110 may use an internal oscillator to provide clocking for the concurrent activation of the wordlines in blocks of memory that share bitlines. Thus, for example, if memory device 110 has thirty-two (32) blocks per bank, and memory device 110 concurrently activates the wordlines for one block in each bank at a time, ~0.33% of the storage cells in memory device 110 can be erased (or scrambled) in less than 1 μS. Thus, repeating this "destructive block activate" (a.k.a., BACT) operation to erase the entire contents of memory device 110 will take less than 300 μS.

Figure 11:
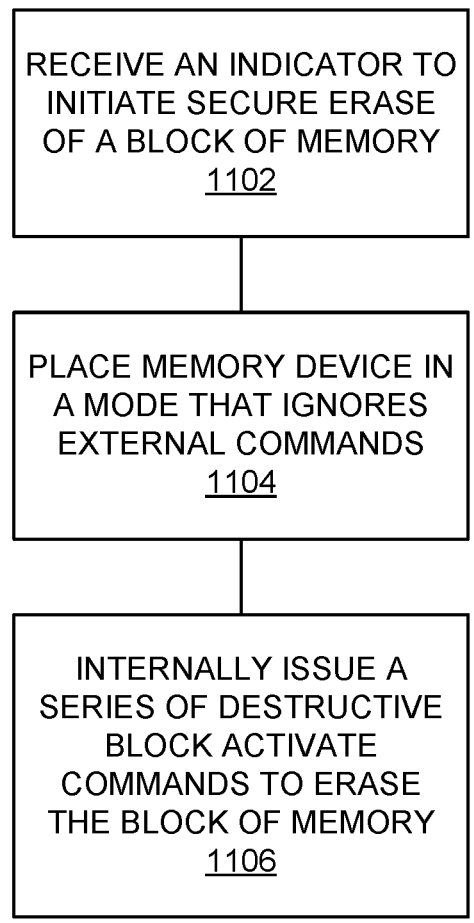

FIG. 11 is a flowchart illustrating example memory erasure operations. One or more steps illustrated in FIG. 11 may be performed by, for example, memory system 100 and/or its components. An indicator to initiate a secure erase of a block of memory in a memory device is received (1102). For example, memory device 110 may receive a command from controller 120 to erase all or part (e.g., bank) of its contents. In another example, memory device 110 may receive, from controller 120, a series of consecutive commands (e.g., three or more consecutive mode register set commands) that indicate to memory device 110 that memory device 110 is to erase all or part of its contents. In another example, a voltage level or other signal on a pin (analogous to a reset signal) may be received by memory device 110 that indicate to memory device 110 that memory device 110 is to erase all or part of its contents. In another example, memory device 110 may detect a temperature change (and a rapid cooling, in particular) that indicates to memory device 110 that memory device 110 is to erase all or part of its contents. In another example, memory device 110 may detect that memory device 110 is being powered-up and this condition indicates to memory device 110 that memory device 110 is to erase all or part of its contents.

The memory device is placed in a mode that ignores external commands (1104). For example, in response to receiving an indicator to erase the entire contents of memory device 110, memory device 110 (and control circuitry 111, in particular) may begin ignoring commands received via interface circuitry 115. A series of destructive block activate commands are internally issued to erase the block of memory (1106). For example, control circuitry 111 of memory device 110 may, while not accepting commands via interface circuitry 115, internally generate and issue a series of destructive block activate commands that concurrently activate the wordlines of blocks of memory that share bitlines. Control circuitry 111 may repeat this process until all of the memory cells 151a-151c, 152a-152c, 153a-153c in memory cell array 150 have been erased.

Figure 12:
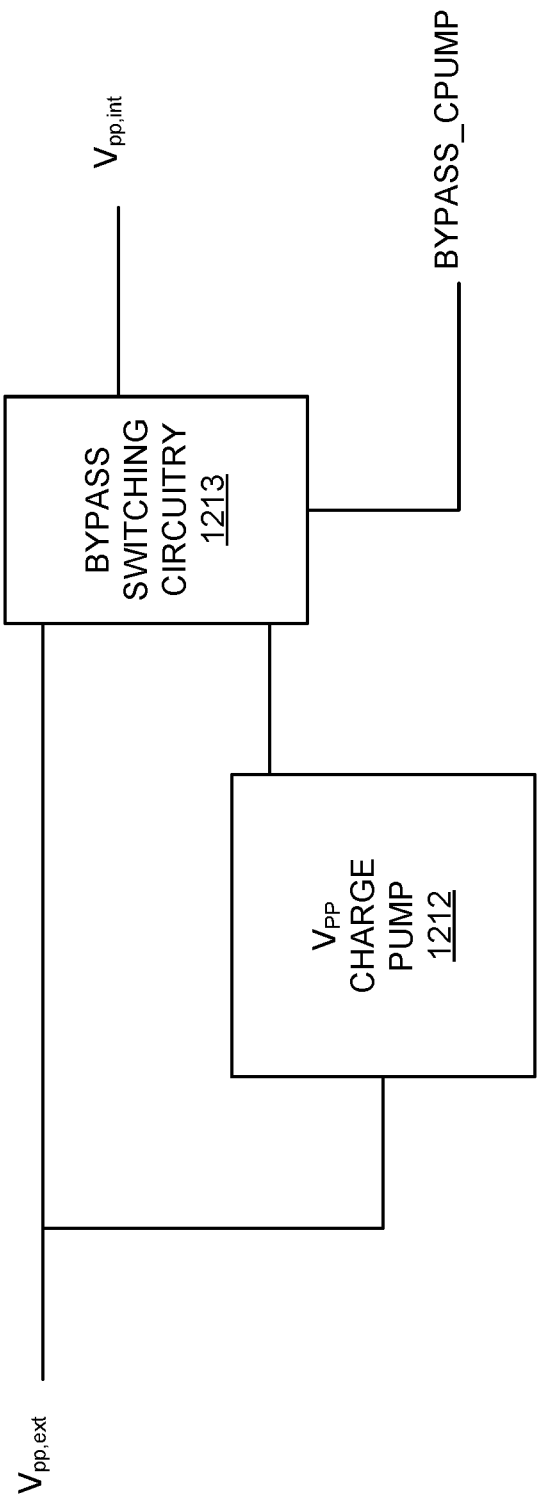
FIG. 12 is a block diagram illustrating a wordline voltage generator.

FIG. 12 is a block diagram illustrating a wordline voltage generator. To improve the retention time of memory cells (e.g., memory cells 151a-151c, 152a-152c, 153a-153c), a memory device (e.g., memory device 110 and/or memory device 510) may utilize a boosted wordline voltage (a.k.a., $V_{PP}$ or $V_{CCP}$) and/or negative substrate bias voltage (a.k.a., $V_{NWL}$ or $V_{BB}$.) During normal operation, these voltages may be generated internally by a charge pump circuit from an externally supplied voltage. In FIG. 12, externally supplied boosted wordline voltage ($V_{pp,ext}$) is provided to an internal charge pump 1212 and to charge pump bypass switching circuitry 1213. The output of internal charge pump 1212 is provided to charge pump bypass switching circuitry 1213. Under the control of the signal BYPASS_CPUMP, charge pump bypass switching circuitry 1213 either provides the output of internal charge pump 1212 or the externally supplied boosted wordline voltage ($V_{pp,ext}$) as the supply to be used as the internally used boosted wordline voltage $V_{pp,int}$. In an embodiment, when performing one or more destructive block activate operations (e.g., when securely erasing a block of memory), the memory device may control charge pump bypass switching circuitry 1213 to provide the externally supplied boosted wordline voltage ($V_{pp,ext}$) as the internally used boosted wordline voltage $V_{pp,int}$. This increases the amount of current that can be supplied to the wordline drivers (e.g., wordline drivers 141-143) during operations where more than one wordlines are concurrently activated.

Figure 13:
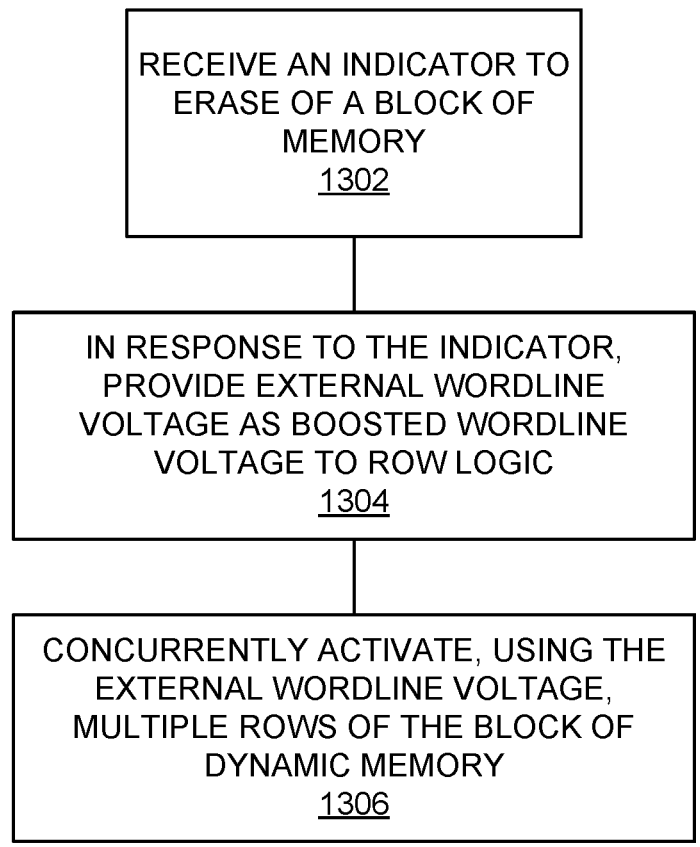
FIG. 13 is a flowchart illustrating an example method of providing a wordline voltage during memory erasure operations.

FIG. 13 is a flowchart illustrating an example method of providing a wordline voltage during memory erasure operations. One or more steps illustrated in FIG. 13 may be performed by, for example, memory system 100 and/or its components. An indicator to erase a block of memory is received (1302). For example, memory device 110 may receive one or more of a command from controller 120, a series of consecutive commands, a voltage level or other signal on a pin, detect a temperature change, and/or detect that memory device 110 is being powered-up.

In response to the indicator, an external wordline voltage is provided as the boosted wordline voltage to row logic (1304). For example, memory device 110 may, in response to an indicator to erase a block of memory, provide an external boosted wordline voltage $V_{PP}$ to row logic 140. Using the external wordline voltage, multiple rows of the block of memory are concurrently activated (1306). For example, memory device 110 may, while providing an external $V_{PP}$ to row logic 140, perform one or more operations that concurrently activate multiple (or all) wordlines of blocks of memory that share bitlines. Control circuitry 111 may repeat these operations while using the external $V_{PP}$ until all of the memory cells 151a-151c, 152a-152c, 153a-153c in memory cell array 150 have been erased.

Figure 14:
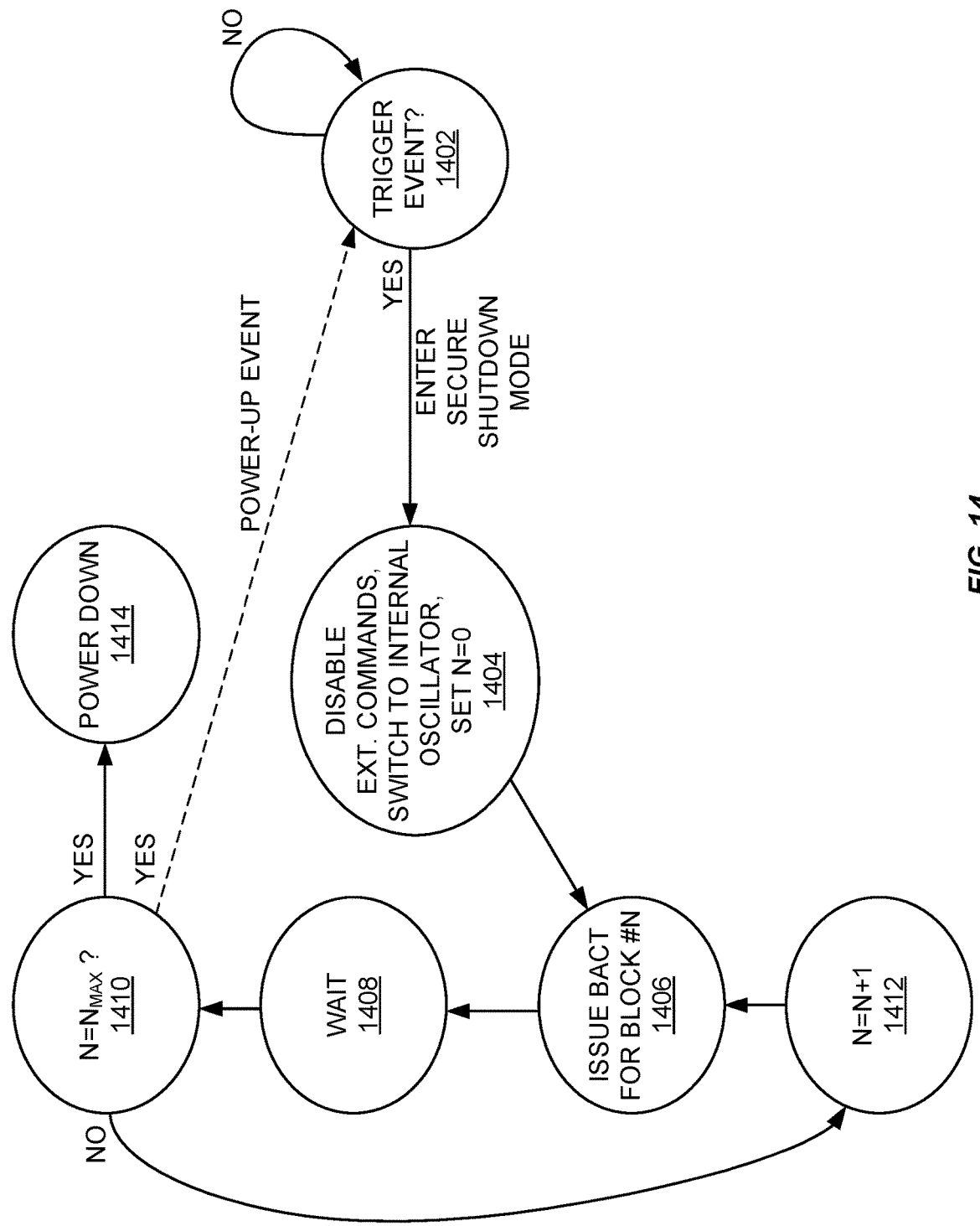
FIG. 14 is a state diagram illustrating an example secure memory erase operation.

FIG. 14 is a state diagram illustrating an example secure memory erase operation. One or more states/steps illustrated in FIG. 14 may be used by, for example, memory system 100 and/or its components. In state 1402, the memory device waits for a trigger event. For example, memory device 110 may wait in a normal operating mode for one or more of a command from controller 120, a series of consecutive commands, a voltage level or other signal on a pin, detect a temperature change, and/or detect that memory device 110 is being powered-up.

When a trigger event occurs, the memory device enters a secure shutdown mode and proceeds to state 1404. In state 1404, the memory device disables external commands, switches to an internal oscillator, and sets a block pointer (N) to an initial value (e.g., zero). If the trigger event was a power-up, the device may optionally use an external oscillator. The memory device then proceeds to state 1406. In state 1406, the memory device generates and issues a destructive block activate (BACT) command for the block associated with the current block pointer value. The memory device proceeds to state 1408 where the memory device waits for the issued destructive block activate command to complete. Once the destructive block activate command completes, the memory device proceeds to state 1410.

In state 1410, the memory device tests whether the just completed destructive block activate command corresponds to the last block to be erased. If the just completed destructive block activate command corresponds to the last block to be erased, and the trigger event was not a power-up event, the memory device proceeds to state 1414 and powers itself down. If the just completed destructive block activate command corresponds to the last block to be erased, and the trigger event was a power-up event, the device proceeds to normal operation and waits for a trigger event in state 1402. If the just completed destructive block activate command does not correspond to the last block to be erased, the memory device proceeds to state 1412. In state 1412, the memory device selects a next block to be erased and proceeds to state 1406 to issue a destructive block activate command for the newly selected block.

Figure 15:
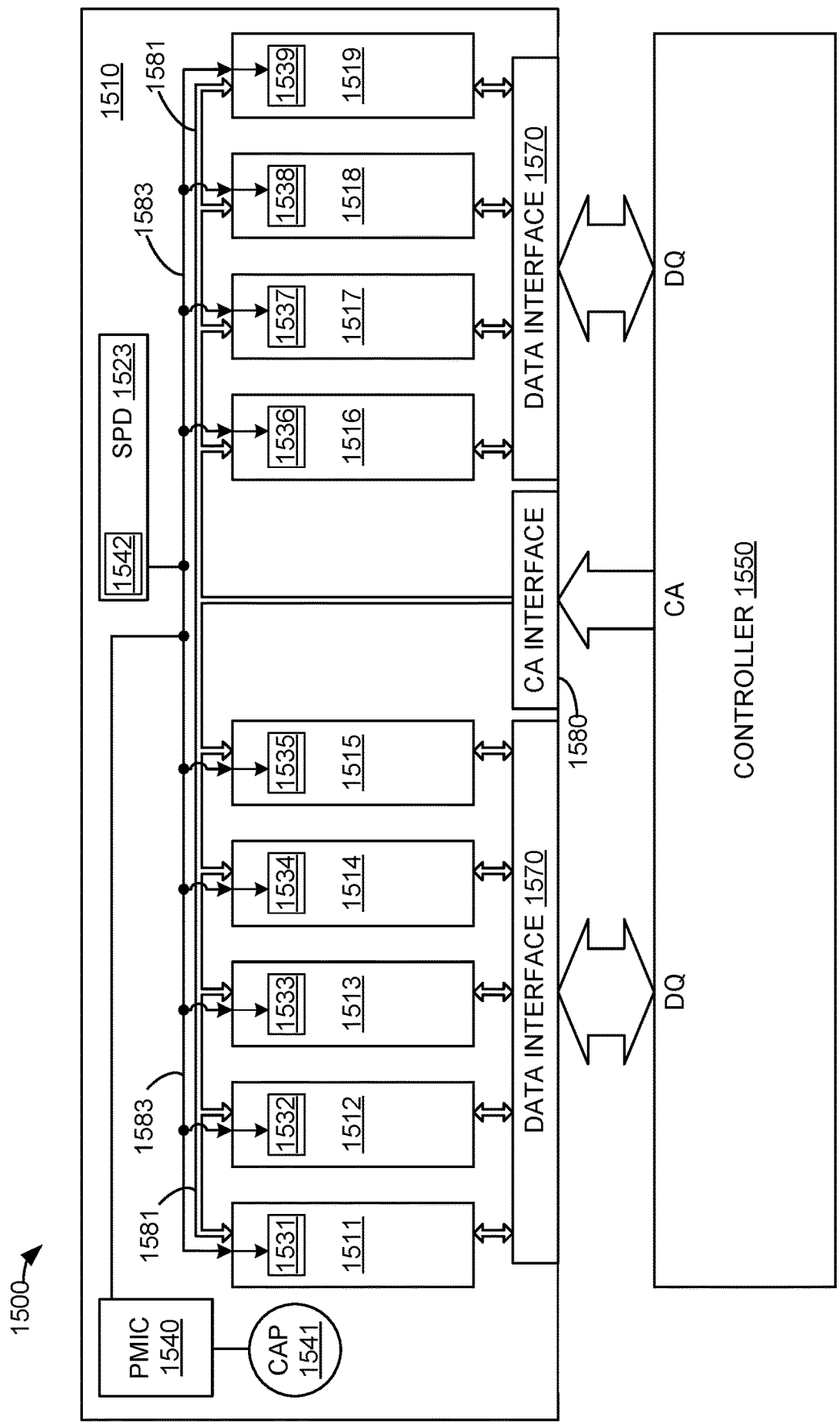
FIG. 15 is a block diagram illustrating a memory module with hot unplug protection.

FIG. 15 is a block diagram illustrating a memory system with hot unplug protection. In FIG. 15, memory system 1500 comprises controller 1550 and module 1510. Controller 1550 is operatively coupled to module 1510 via data signals (DQ) and command-address signals (CA). Module 1510 includes memory components 1511-1519, serial presence detect (SPD) device 1523, power management circuit (PMIC) 1540, capacitor 1541, data interface 1570, and command-address interface 1580. Memory components 1511-1519 include secure erase circuitry 1531-1539, respectively. SPD device 1523 includes temperature sensing circuitry 1542. Command-address interface 1580 is operatively coupled to memory components 1511-1519 via command-address bus 1581. Command-address interface 1580 and command-address bus 1581 may include command and address signals, clocks, strobes, and other timing and control signals.

Controller 1550 and memory components 1511-1519 may be integrated circuit type devices, such as are commonly referred to as "chips". A memory controller, such as controller 1550, manages the flow of data going to and from memory devices and/or memory modules. Memory components 1511-1519 may be standalone devices, or may include multiple memory integrated circuit dies—such as components of a multi-chip module. A memory controller can be a separate, standalone chip, or integrated into another chip. For example, a memory controller may be included on a single die with a microprocessor, or included as part of a more complex integrated circuit system, such as a block of a system on a chip (SOC).

SPD device 1523 is operatively coupled to memory components 1511-1519 via trigger signal 1583. PMIC 1540 is also operatively coupled to memory components 1511-1519 via trigger signal 1583. PMIC 1540 and SPD are operatively coupled to memory components 1511-1519 via trigger signal 1583 in a "wired-OR" configuration. In an embodiment, trigger signal 1583 is not accessible on an external conductor layer of module 1510.

In an embodiment, when PMIC 1540 detects a power loss condition, PMIC 1540 signals memory components 1511-1519 (and secure erase circuitry 1531-1539, in particular), via trigger signal 1583, to initiate a secure erase of the information stored in memory components 1511-1519. In response, memory components 1511-1519 (and secure erase circuitry 1531-1539, in particular) may stop performing commands received from controller 1550 via CA bus 1581. Memory components 1511-1519 each perform secure memory erase operations. Memory components 1511-1519 may each perform secure memory erase operations using, for example, the operations described herein with respect to FIG. 14. PMIC 1540 may draw power from capacitor 1541 and provide power supplies to memory components 1511-1519 during the secure memory erase operations to ensure memory components 1511-1519 can complete the secure memory erase operations.

Similarly, when SPD device 1523 (and temperature sensing circuitry 1542, in particular) detects a rapid cooling or other anomalous temperature condition (e.g., temperature is below −50° C.), SPD device 1523 signals memory components 1511-1519 (and secure erase circuitry 1531-1539, in particular), via trigger signal 1583, to initiate a secure erase of the information stored in memory components 1511-1519. In response, memory components 1511-1519 (and secure erase circuitry 1531-1539, in particular) may stop performing commands received from controller 1550 via CA bus 1581. Memory components 1511-1519 each perform secure memory erase operations. Memory components 1511-1519 may each perform secure memory erase operations using, for example, the operations described herein with respect to FIG. 14.

Figure 16:
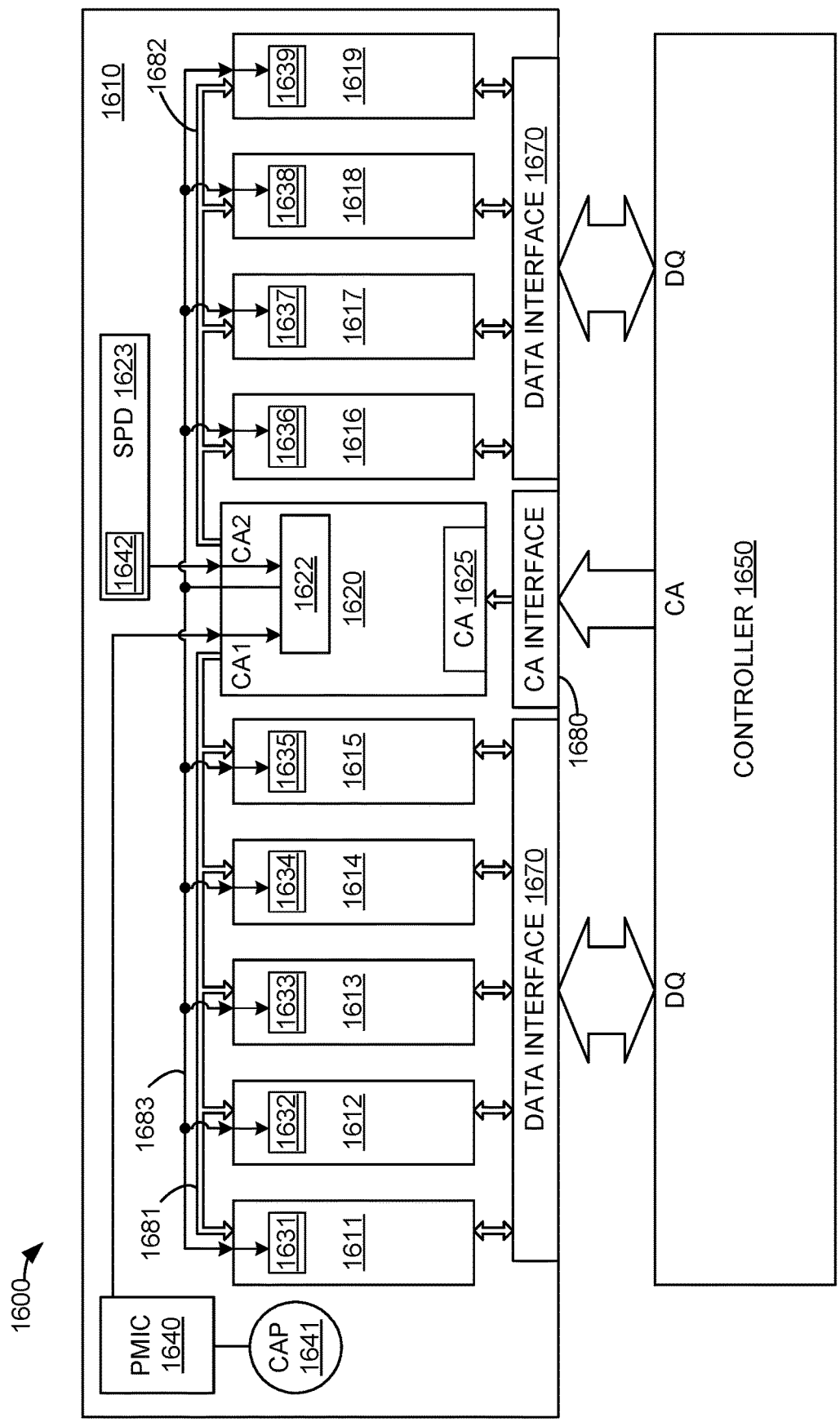
FIG. 16 is a block diagram illustrating a registered memory module with hot unplug protection.

FIG. 16 is a block diagram illustrating a memory system with hot unplug protection. In FIG. 16, memory system 1600 comprises controller 1650 and module 1610. Controller 1650 is operatively coupled to module 1610 via data signals (DQ) and command-address signals (CA). Module 1610 includes memory components 1611-1619, buffer 1620, SPD device 1623, PMIC 1640, capacitor 1641, data interface 1670, and command-address interface 1680. Memory components 1611-1619 include secure erase circuitry 1631-1639, respectively. SPD device 1623 includes temperature sensing circuitry 1642. Buffer 1620 includes secure erase control circuitry 1622 and CA interface 1625.

Command-address interface 1680 is operatively coupled to CA interface 1625 of buffer 1620. Buffer 1620 is operatively coupled to memory components 1611-1615 via secondary command-address bus CA1 1681. Buffer 1620 is operatively coupled to memory components 1616-1619 via secondary command-address bus CA2 1682. Buffer 1620 may also be known as a CA Register or a Registered Clock Driver (RCD). Thus, module 1610 may be considered to be a registered module, or R-DIMM. Command-address interface 1680 and command-address busses 1681-1682 may include command and address signals, clocks, strobes, and other timing and control signals.

Controller 1650, buffer 1620, and memory components 1611-1619 may be integrated circuit type devices, such as are commonly referred to as "chips". A memory controller, such as controller 1650, manages the flow of data going to and from memory devices and/or memory modules. Memory components 1611-1619 may be standalone devices, or may include multiple memory integrated circuit dies— such as components of a multi-chip module. A memory controller can be a separate, standalone chip, or integrated into another chip. For example, a memory controller may be included on a single die with a microprocessor, or included as part of a more complex integrated circuit system, such as a block of a system on a chip (SOC).

Buffer 1620 is operatively coupled to CA interface 1680 and memory components 1611-1619 to reduce the electrical loading placed on the CA signals from controller 1650. In an embodiment, all command-address traffic sent between controller 1650 and memory components 1611-1619 is first received by buffer 1620 via CA interface 1680 and CA interface 1625.

SPD device 1623 is operatively coupled to buffer 1620. PMIC 1640 is also operatively coupled to buffer 1620. In an embodiment, buffer 1620 may be operatively coupled to memory components 1611-1619 via trigger signal 1683. In an embodiment, trigger signal 1683 is not accessible on an external conductor layer of module 1610.

In an embodiment, when PMIC 1640 detects a power loss condition, PMIC 1640 signals buffer 1620. In response, buffer 1620 signals memory components 1611-1619 (and secure erase circuitry 1631-1639, in particular) to initiate a secure erase of the information stored in memory components 1611-1619. In embodiments that include trigger signal 1683, buffer 1620 may signal memory components 1611-1619 (and secure erase circuitry 1631-1639, in particular) to initiate a secure erase of the information stored in memory components 1611-1619 using trigger signal 1683. In embodiments that do not include trigger signal 1683, buffer 1620 (and secure erase control circuitry 1622, in particular) may issue one or more commands via CA1 1681 and CA2 1682 to initiate the secure erase of the information stored in memory components 1611-1619. In response, memory components 1611-1619 (and secure erase circuitry 1631-1639, in particular) may stop performing any additional commands. Memory components 1611-1619 then each perform secure memory erase operations. Memory components 1611-1619 may each perform secure memory erase operations using, for example, the operations described herein with respect to FIG. 14. PMIC 1640 may draw power from capacitor 1641 and provide power supplies to memory components 1611-1619 and buffer 1620 during the secure memory erase operations to ensure the secure memory erase operations are completed.

Similarly, when SPD device 1623 (and temperature sensing circuitry 1642, in particular) detects a rapid cooling or other anomalous temperature condition (e.g., temperature is below −50° C.), SPD device 1623 signals buffer 1620 to initiate a secure erase of the information stored in memory components 1611-1619. In embodiments that include trigger signal 1683, buffer 1620 may signal memory components 1611-1619 (and secure erase circuitry 1631-1639, in particular) to initiate a secure erase of the information stored in memory components 1611-1619 using trigger signal 1683. In embodiments that do not include trigger signal 1683, buffer 1620 (and secure erase control circuitry 1622, in particular) may issue one or more commands via CA1 1681 and CA2 1682 to initiate the secure erase of the information stored in memory components 1611-1619. In response, memory components 1611-1619 (and secure erase circuitry 1631-1639, in particular) may stop performing any additional commands. Memory components 1611-1619 then each perform secure memory erase operations. Memory components 1611-1619 may each perform secure memory erase operations using, for example, the operations described herein with respect to FIG. 14.

Figure 17:
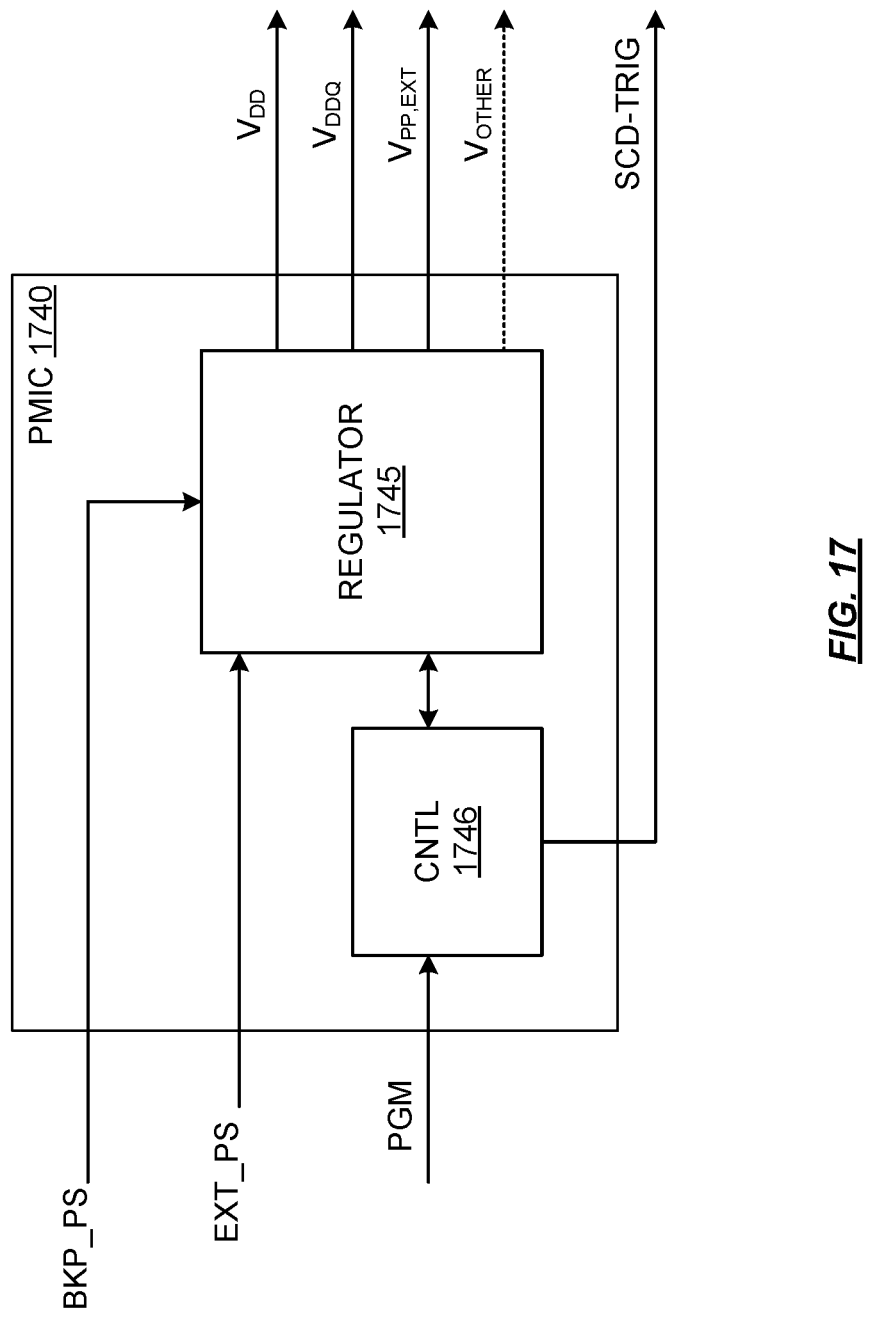
FIG. 17 is a block diagram illustrating an example power management circuit for hot unplug protection of a memory module.

FIG. 17 is a block diagram illustrating an example power management circuit for hot unplug protection of a memory module. In FIG. 17, power management integrated circuit 1740 includes control circuitry 1746 and voltage regulator 1745. PMIC 1740 may be, for example, used on module 1500 as PMIC 1540 and/or used on module 1600 as PMIC 1640. Control circuitry 1746 receives programming signals (e.g., I2C or I3C) and is operatively coupled to regulator 1745. Regulator 1745 receives one or more external power supplies EXT_PS (e.g., 12V) and provides the power supplies for the module. For example, PMIC 1740 may generate and supply main voltage $V_{DD}$, I/O supply $V_{DDQ}$, external boosted wordline voltage, $V_{PP,EXT}$, etc. to the components on a module from the one or more external power supplies EXT_PS.

Regulator 1745 also receives a backup power supply BKP_PS. In an embodiment, the backup power supply is provided by a capacitor (e.g., capacitor 1541 and/or 1641) that stores enough energy to allow the components on a module to perform secure erasing operations. If PMIC 1740 detects the external power supplies have failed and/or are not within specified limits, PMIC 1740 switches to drawing power from the backup power supply and outputs a trigger signal SCD-TRIG to initiate secure erasing operations by one or more components on the module.

Figure 18:
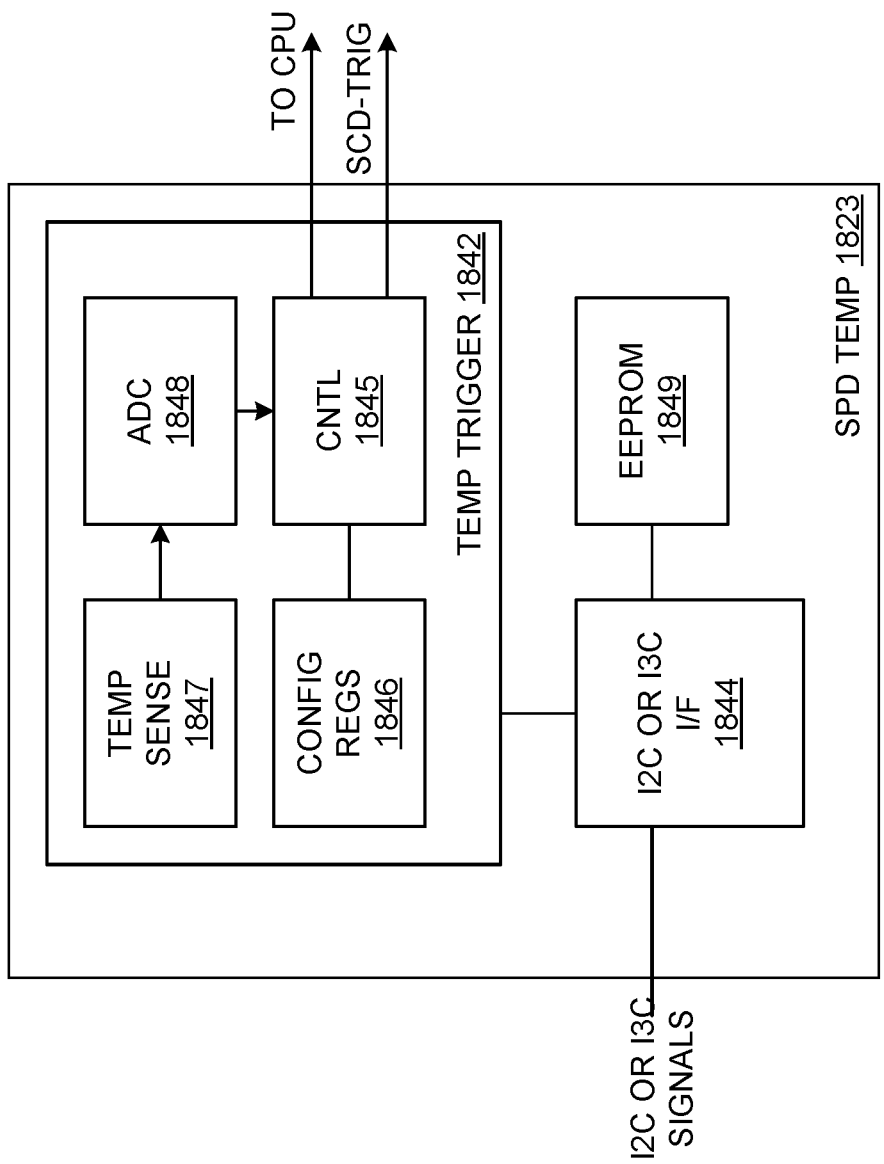
FIG. 18 is a block diagram illustrating a serial presence detect circuit for hot unplug protection of a memory module.

FIG. 18 is a block diagram illustrating a serial presence detect circuit for hot unplug protection of a memory module. In FIG. 18, SPD temperature trigger device 1823 includes temperature trigger circuitry 1842, I2C and/or I3C interface 1844, and nonvolatile memory 1849. SPD device 1823 may be, for example, used on module 1500 as SPD device 1523 and/or used on module 1600 as SPD device 1623. Interface 1844 is operatively coupled to temperature trigger circuitry 1842 and nonvolatile memory 1849. Temperature trigger circuitry 1842 includes configuration registers 1846, temperature sensor 1847, analog-to-digital converter (ADC) 1848, and control circuitry 1845.

Temperature sensor 1847 is operatively coupled to ADC 1848. ADC 1848 converts an analog signal from temperature sensor 1847 into a digital value. This digital value is provided to control circuitry 1845. Configuration register 1846 values are also provided to control circuitry 1845. In an embodiment, one or more configuration register 1846 values may be set via interface 1844. Based on the values from ADC 1848, control circuitry 1845 may detect a rapid cooling or other anomalous temperature condition (e.g., temperature is below −50° C.). When SPD device 1823 detects a rapid cooling or other anomalous temperature condition, SPD device 1823 outputs a trigger signal SCD-TRIG to initiate secure erasing operations by one or more (or all) DRAM components on the module. In an embodiment, SPD device 1823 may also signal a host processor or other component that a rapid cooling or other anomalous temperature condition has been detected. SPD device 1823 may also signal a host processor or other component that an overheating condition has been detected so the host processor or other component may reduce the power being consumed/dissipated by the module (e.g., by lowering performance and/or clock frequency, etc.) In an embodiment, SPD device 1823 may signal a host processor or other component that a rapid cooling or other anomalous temperature condition has been detected or that an overheating condition has been detected using the same signals, bus, and/or signaling method.

Figure 19:
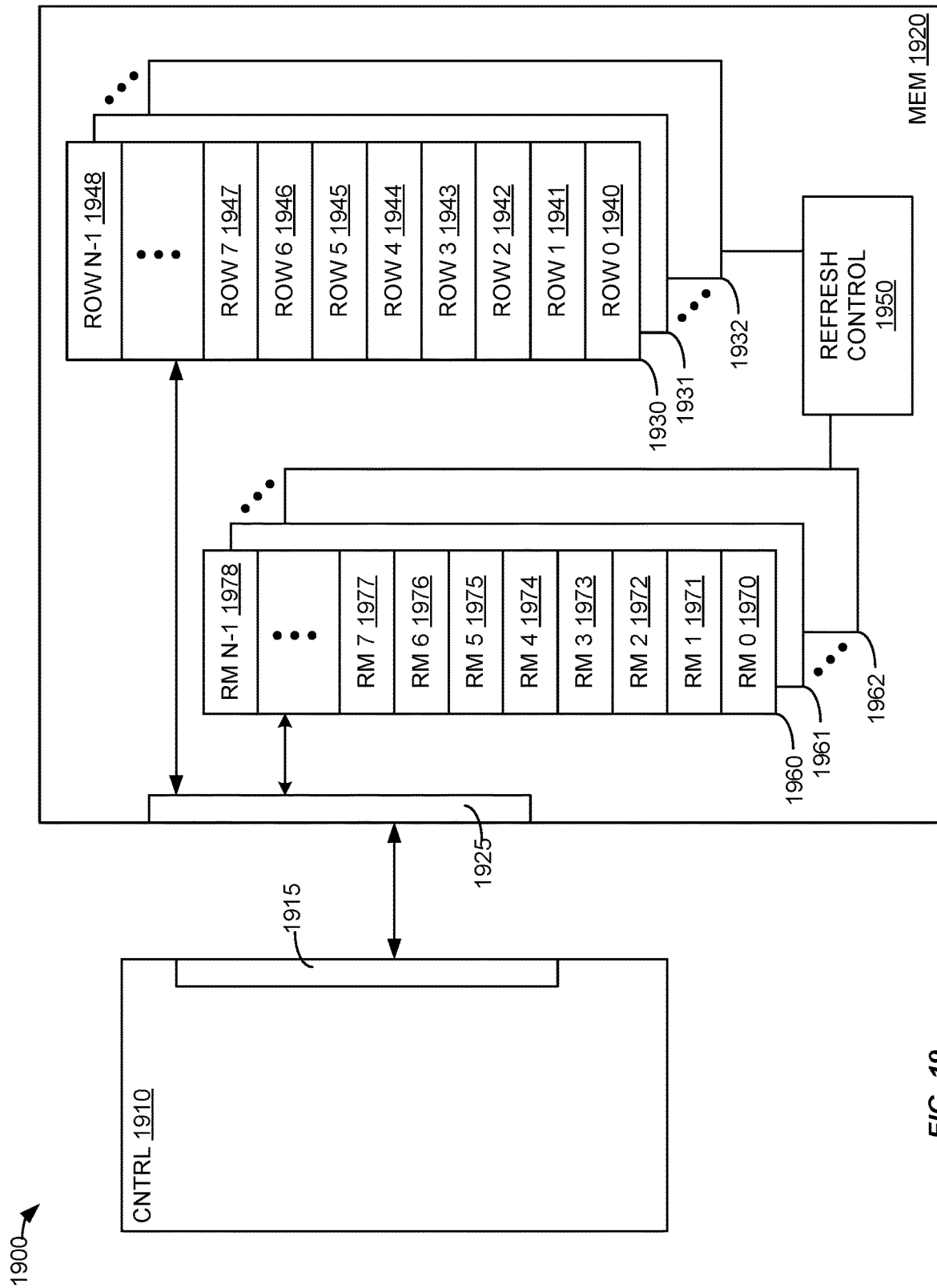
FIG. 19 is a block diagram illustrating a memory system.

FIG. 19 is a block diagram illustrating a memory system. In FIG. 19, memory system 1900 comprises controller 1910 and memory component 1920. Memory component 1920 includes memory banks 1930-1932, refresh mask register banks 1960-1962, refresh control circuitry 1950, and interface 1925. Each memory bank is comprised of rows 1940-1948 of information storing memory cells. In FIG. 19, memory bank 1930 is illustrated as having row 0 1940, row 1 1941, row 2 1942, row 3 1943, row 4 1944, row 5 1945, row 6 1946, row 7 1947, a plurality of rows that are not illustrated in FIG. 19 for the sake of brevity, and, row N−1 1948. Refresh mask register banks 1960-1962 are respectively associated with memory banks 1930-1932. In FIG. 19, refresh mask register bank 1960 is illustrated as having refresh mask register 0 1970, refresh mask register 1 1971, refresh mask register 2 1972, refresh mask register 3 1973, refresh mask register 4 1974, refresh mask register 5 1975, refresh mask register 6 1976, refresh mask register 7 1977, a plurality of refresh mask registers that are not illustrated in FIG. 19 for the sake of brevity, and, refresh mask register N−1 1978. Controller 1910 includes interface 1915.

Controller 1910 and memory component 1920 may be integrated circuit type devices, such as are commonly referred to as "chips". A memory controller, such as controller 1910, manages the flow of data going to and from memory devices and/or memory modules. Memory component 1920 may be a standalone device, a stacked die device, or may include a number of dies or stacked dies disposed on a memory module. Memory component 1920 may be co-packaged with a controller die using wire-bonds or through silicon vias (TSV). A memory controller can be a separate, standalone chip, or integrated into another chip. For example, a memory controller may be included on a single die with a microprocessor, or included as part of a more complex integrated circuit system such as a block of a system on a chip (SOC).

Controller 1910 is operatively coupled to memory component 1920 via at least one command address interface. Controller 1910 is operatively coupled to memory component 1920 to send commands to memory component 1920. Memory component 1920 receives the commands (and addresses) via a corresponding command address interface.

In an embodiment, memory component 1920 may be configured to skip refresh operations for one or more rows 1940-1948 by setting a value in an associated refresh mask register 1970-1978. For example, memory component 1920 may be configured by controller 1910 to skip refresh operations for row 3 1943 by setting a corresponding bit in refresh mask register 3 1973 to a value that indicates to memory component 1920 that refresh operations should not be performed on row 3 1943. To set or unset bits (i.e., refresh masking indicators) in refresh mask register banks 1960-1962, controller 1910 may issue mode-register write (MRW) commands to memory component 1920.

In an embodiment, refresh control circuitry 1950 may generate row addresses to be refreshed. For example, refresh control circuitry 1950 may be configured to select a candidate row refresh address that selects the row to be refreshed upon receiving the next refresh command. The order these candidates are selected may be one that steps through row addresses in a linear order from row 0 to row N−1 and then back to row 0, etc. to ensure each row is periodically refreshed. Refresh control circuitry 1950 is operatively coupled to refresh mask register banks 1960-1962 to determine which (if any) row addresses should not be refreshed. The contents of refresh mask register banks 1960-1962 may alter the next candidate (and thus the next row refreshed.) For example, if the bit in refresh mask register 3 1973 is set to a value that indicates to memory component 1920 that refresh operations should not be performed on row 3 1943, refresh control circuitry 1950 may generate an address to refresh row 2 1942, and then generate an address to refresh row 4 1944 without generating an intervening address to refresh row 3 1943.

It should be understood that different configurations of refresh mask register banks 1960-1962 may be implemented. For example, rather than each refresh mask register 1970-1978 corresponding to one row 1940-1948, each refresh mask register 1970-1978 may correspond to multiple rows or multiple row ranges. In another embodiment, refresh mask registers 1970-1978 may hold a multi-bit count value. As long as the count value is non-zero (or meets some other threshold criteria) the corresponding row 1940-1948 (or row range, etc.) is refreshed. When the count value reaches zero (or meets the criteria), the corresponding row 1940-1948 is not refreshed. In an embodiment, a write operation to a row 1940-1948 sets the initial count value and each read operation to that row 1940-1948 decrements the count value. In an embodiment, the count value may be set with an MRW command from controller 1910. In an embodiment, when the count value reaches zero (or meets the criteria), read operations of the corresponding row 1940-1948 are not performed. This ensures that a series of read operations to a row 1940-1948 that should not be refreshed do not prolong the persistence of data in that row 1940-1948.

In some embodiments, memory system 1900 may also include circuitry and/or functionality described with reference to memory system 100, and/or memory system 500; and/or be configured to additionally perform one or more, or all of the functions described herein with reference to FIGS. 1-18. Likewise, in some embodiments, memory system 100, and/or memory system 500 may also include circuitry and/or functionality described herein with reference to memory system 1900; and/or be configured to additionally perform one or more, or all of the functions described herein with reference to FIGS. 1-18. For example, system 1900 may be implemented to additionally perform all or parts of the described destructive block activate functionality and/or destructive precharge functionality. Likewise, for example, system 100 and/or system 500 may be implemented to additionally perform all or parts of the described refresh masking functionality.

Figure 20:
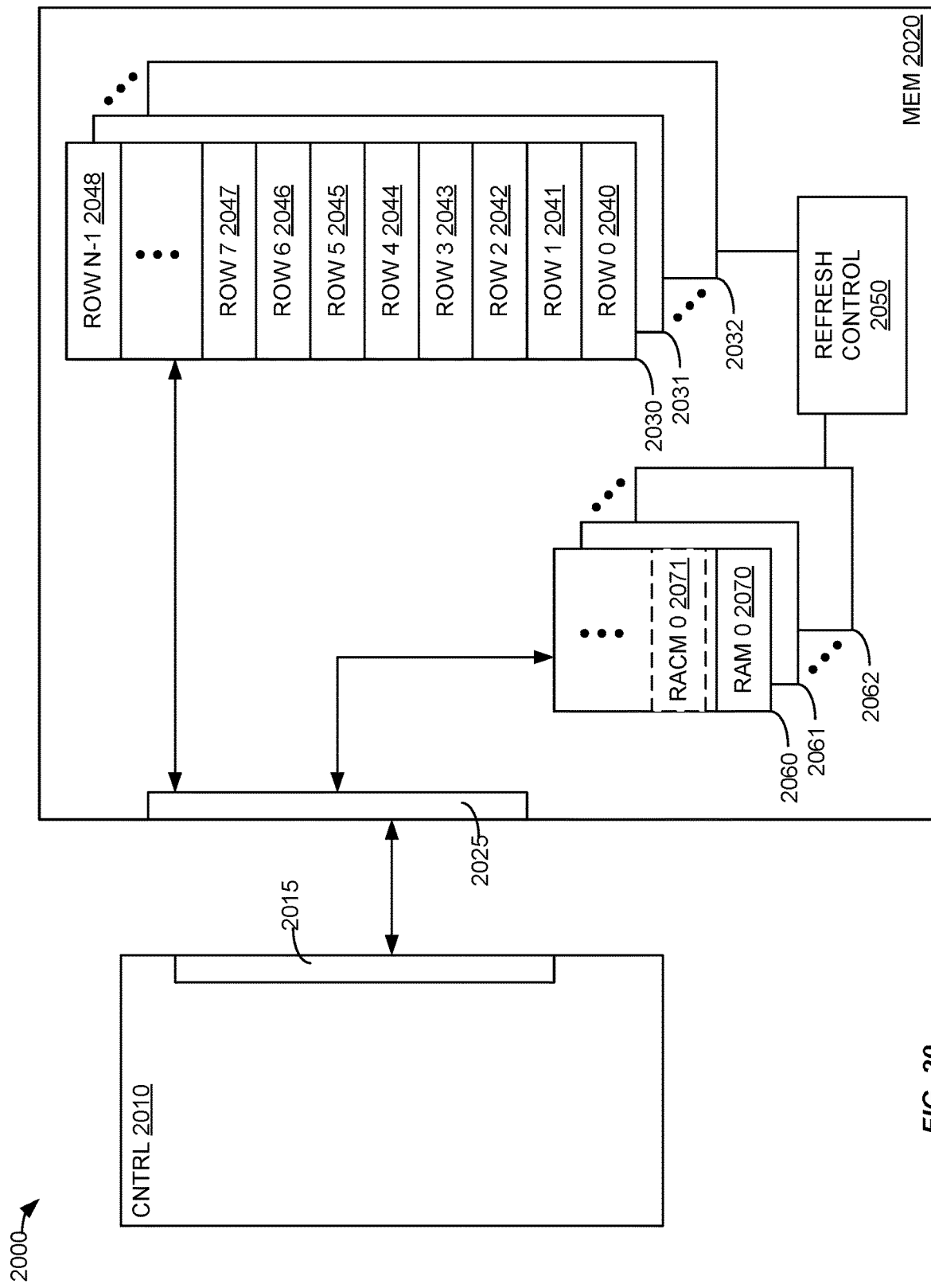
FIG. 20 is a block diagram illustrating a memory system.

FIG. 20 is a block diagram illustrating a memory system. In FIG. 20, memory system 2000 comprises controller 2010 and memory component 2020. Memory component 2020 includes memory banks 2030-2032, refresh address mask register banks 2060-2062, refresh control circuitry 2050, and interface 2025. Each memory bank is comprised of rows 2040-2048 of information storing memory cells. In FIG. 20, memory bank 2030 is illustrated as having row 0 2040, row 1 2041, row 2 2042, row 3 2043, row 4 2044, row 5 2045, row 6 2046, row 7 2047, a plurality of rows that are not illustrated in FIG. 20 for the sake of brevity, and, row N−1 2048. Refresh address mask register banks 2060-2062 are respectively associated with memory banks 2030-2032. In FIG. 20, refresh address mask register bank 2060 is illustrated as having refresh address mask register 0 2070, and refresh address compare mask register 1 2071. An optional plurality of additional refresh address mask registers and refresh address compare mask registers are not illustrated in FIG. 20 for the sake of brevity. Controller 2010 includes interface 2015.

Controller 2010 and memory component 2020 may be integrated circuit type devices, such as are commonly referred to as "chips". A memory controller, such as controller 2010, manages the flow of data going to and from memory devices and/or memory modules. Memory component 2020 may be a standalone device, a stacked die device, or may include a number of dies or stacked dies disposed on a memory module. Memory component 2020 may be co-packaged with a controller die using wire-bonds or through silicon vias (TSV). A memory controller can be a separate, standalone chip, or integrated into another chip. For example, a memory controller may be included on a single die with a microprocessor, or included as part of a more complex integrated circuit system such as a block of a system on a chip (SOC).

Controller 2010 is operatively coupled to memory component 2020 via at least one command address interface. Controller 2010 is operatively coupled to memory component 2020 to send commands to memory component 2020. Memory component 2020 receives the commands (and addresses) via a corresponding command address interface.

In an embodiment, memory component 2020 may be configured to skip refresh operations for one or more rows 2040-2048 by setting a row address value in refresh address mask register 2070. For example, memory component 2020 may be configured by controller 2010 to skip refresh operations for row 3 2043 by setting the row address of row 3 2043 (e.g., 3) in refresh address mask register 2070. To set the value in refresh address mask register 2070, controller 2010 may issue mode-register write (MRW) commands to memory component 2020.

In an embodiment, memory component 2020 may be configured to skip refresh operations for variable ranges of rows 2040-2048 by setting a row address compare mask value in refresh address compare mask register 2071. The bits in row address compare mask register are used to remove (or include) bits from address comparisons that determine whether memory component 2020 is to refresh a given row. For example, memory component 2020 may be configured by controller 2010 to skip refresh operations for row 2 2042 and row 3 2043 by setting the row address of row 3 2043 (e.g., 3) in refresh address mask register 2070 and also setting the value in refresh address compare mask register 2071 to remove the least significant bit of the row addresses from row address comparisons used to determine whether a row is to be refreshed. By removing the least significant bit from refresh address comparisons, the row address for row 2 2042 and the row address for row 3 2043 produce the same result. In another example, memory component 2020 may be configured by controller 2010 to skip refresh operations for row 0 2040, row 1 2041, row 2 2042 and row 3 2043 by setting the row address of row 3 2043 (e.g., 3) in refresh address mask register 2070 and also setting the value in refresh address compare mask register 2071 to remove the least significant two (2) bits of the row addresses from row address comparisons used to determine whether a row is to be refreshed. To set the value in refresh address compare mask register 2071, controller 2010 may issue mode-register write (MRW) commands to memory component 2020.

In this manner, multiple rows 2040-2048 may be masked from refresh. In some embodiments, window comparators or Ternary CAMs that ignore a configurable (e.g., by the value in row address compare mask register 2071) least-significant number of row address bits from the row address comparison results may be used to mask contiguous ranges of row addresses from refresh operations.

In an embodiment, refresh control circuitry 2050 may generate row addresses to be refreshed. For example, refresh control circuitry 2050 may be configured to select a candidate row refresh address that selects the row to be refreshed upon receiving the next refresh command. The order these candidates are selected may be one that steps through row addresses in a linear order from row 0 to row N−1 and then back to row 0, etc. to ensure each row is periodically refreshed. Refresh control circuitry 2050 is operatively coupled to refresh address mask register banks 2060-2062 to determine which (if any) row addresses should not be refreshed. As described herein, the contents of refresh address mask register banks 2060-2062 may alter the next candidate (and thus the next row refreshed.) For example, if the values in refresh address mask register 2070 and refresh address comparison mask register 2071 are set to values that indicate to memory component 2020 that refresh operations should not be performed on row 2 2042 and row 3 2043, refresh control circuitry 2050 may generate an address to refresh row 1 2041, and then generate an address to refresh row 4 2044 without generating intervening addresses to refresh row 2 2042 and row 3 2043.

It should be understood that different configurations of refresh address mask register banks 2060-2062 may be implemented. For example, rather than each refresh address mask register 2070 corresponding to one row 2040-2048 address value, each refresh address mask register 2070 (if there is more than one) may, before being further masked by row address compare mask register 2071, correspond to multiple rows or multiple row ranges.

In another embodiment, a refresh countdown register (not shown in FIG. 20) corresponding to the value in refresh address mask register 2070 may hold a multi-bit count value. As long as the count value is non-zero (or meets some other threshold criteria) the corresponding row 2040-2048 (or row range, etc.) to the value in refresh address mask register 2070 is refreshed. When the count value reaches zero (or meets the criteria), the corresponding row 2040-2048 (or row range, etc.) is not refreshed. In an embodiment, a write operation to a row 2040-2048 sets the initial count value and each read operation to that row 2040-2048 (or row range, etc.) decrements the count value. In an embodiment, the count value may be set with an MRW command from controller 2010. In an embodiment, when the count value reaches zero (or meets the criteria), read operations of the corresponding row 2040-2048 (or row range, etc.) are not performed. This ensures that a series of read operations to a row 2040-2048 (or row range, etc.) that should not be refreshed do not prolong the persistence of data in that row 2040-2048 (or row range, etc.)

In some embodiments, memory system 2000 may also include circuitry and/or functionality described with reference to memory system 100, memory system 500, and/or memory system 1900; and/or be configured to additionally perform one or more, or all of the functions described herein with reference to FIGS. 1-19. Likewise, in some embodiments, memory system 100, memory system 500, and/or memory system 1900 may also include circuitry and/or functionality described herein with reference to memory system 2000; and/or be configured to additionally perform one or more, or all of the functions described herein with reference to FIGS. 1-19. For example, system 2000 may be implemented to additionally perform all or parts of the described destructive block activate functionality and/or destructive precharge functionality. Likewise, for example, system 100, system 500, and/or system 1900 may be implemented to additionally perform all or parts of the described row address refresh masking functionality.

Figure 21:
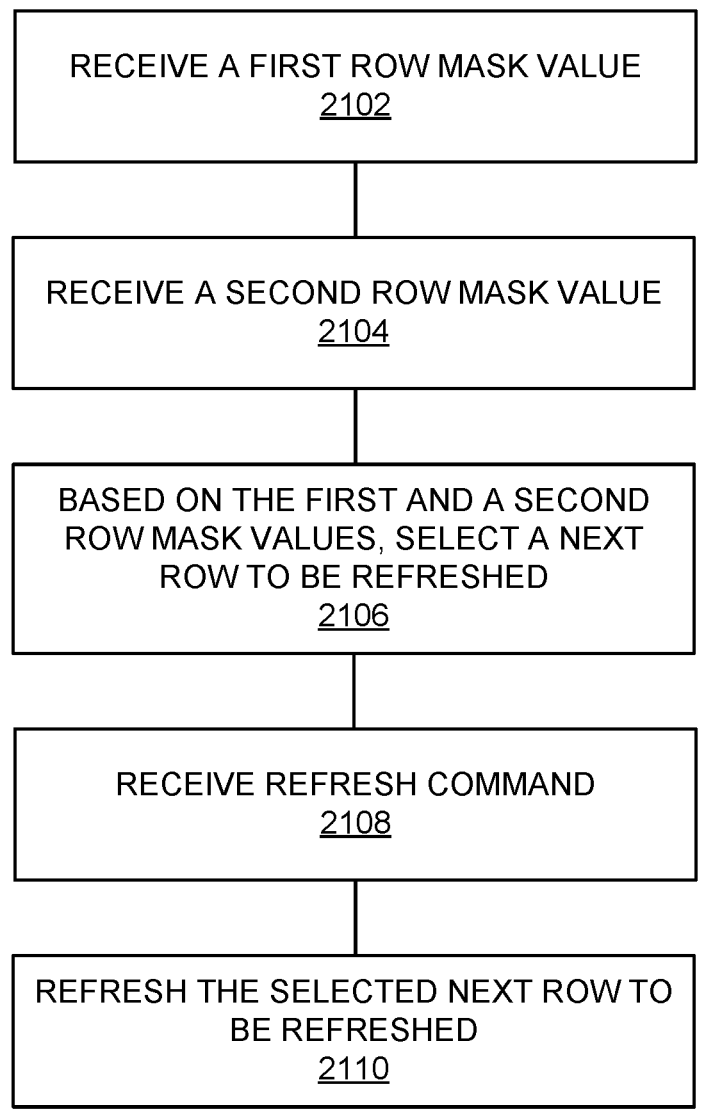
FIGS. 21-23 are flowcharts illustrating example operations for reduced data persistence.

FIG. 21 is a flowchart illustrating example operations for reduced data persistence. One or more steps illustrated in FIG. 21 may be performed by, for example, memory system 1900 and/or its components. A first row mask value is received (2102). For example, controller 1910 may write a first value into row mask register 1973 of memory component 1920 that indicates row 3 1943 is not to be refreshed.

A second row mask value is received (2104). For example, controller 1910 may write a second value into row mask register 1974 of memory component 1920 that indicates row 4 1944 is to be refreshed. Based on the first and second row mask values, a next row to be refreshed is selected (2106). For example, after refresh control circuitry 1950 refreshes row 2 1942, refresh control circuitry 1950 may, based on the first value in refresh mask register 3 1973 indicating row 3 1943 is not to be refreshed, and the second value in refresh mask register 4 1974 indicating row 4 1944 is to be refreshed, select row 4 1944 as the next row to be refreshed.

A refresh command is received (2108). For example, controller 1910 may send a refresh command to memory component 1920 via interface 1915 and interface 1925. The selected next row to be refreshed is refreshed (2110). For example, in response to the refresh command, memory component 1920, and refresh control circuitry 1950 may refresh row 4 1944.

Figure 22:
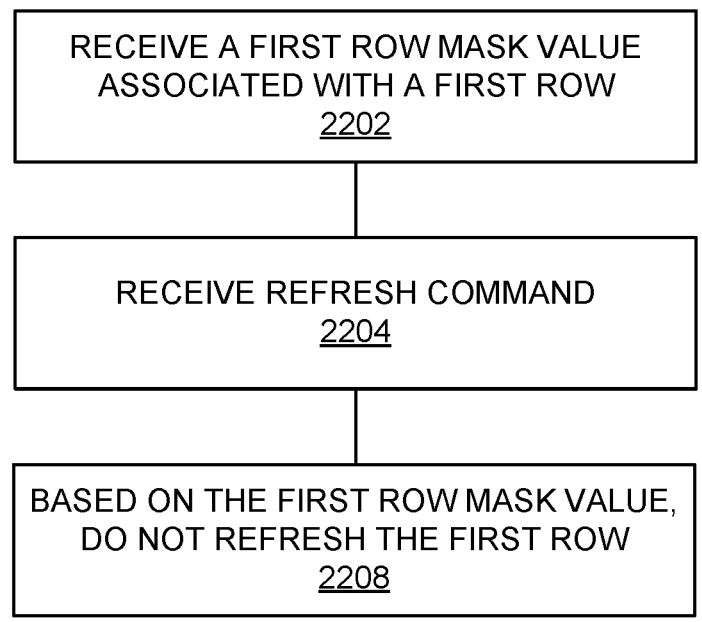

FIG. 22 is a flowchart illustrating example operations for reduced data persistence. One or more steps illustrated in FIG. 22 may be performed by, for example, memory system 1900 and/or its components. A first row mask value associated with a first row is received (2202). For example, controller 1910 may write a first value into row mask register 1973 of memory component 1920 that indicates row 3 1943 is not to be refreshed.

A refresh command is received (2204). For example, controller 1910 may send a refresh command to memory component 1920 via interface 1915 and interface 1925. Based on the first row mask value, the first row is not refreshed. For example, in response to the refresh command, memory component 1920, and based on the value in refresh mask register 1943, memory component 1920 may select a different row to be refreshed in response to the refresh command from controller 1910.

Figure 23:
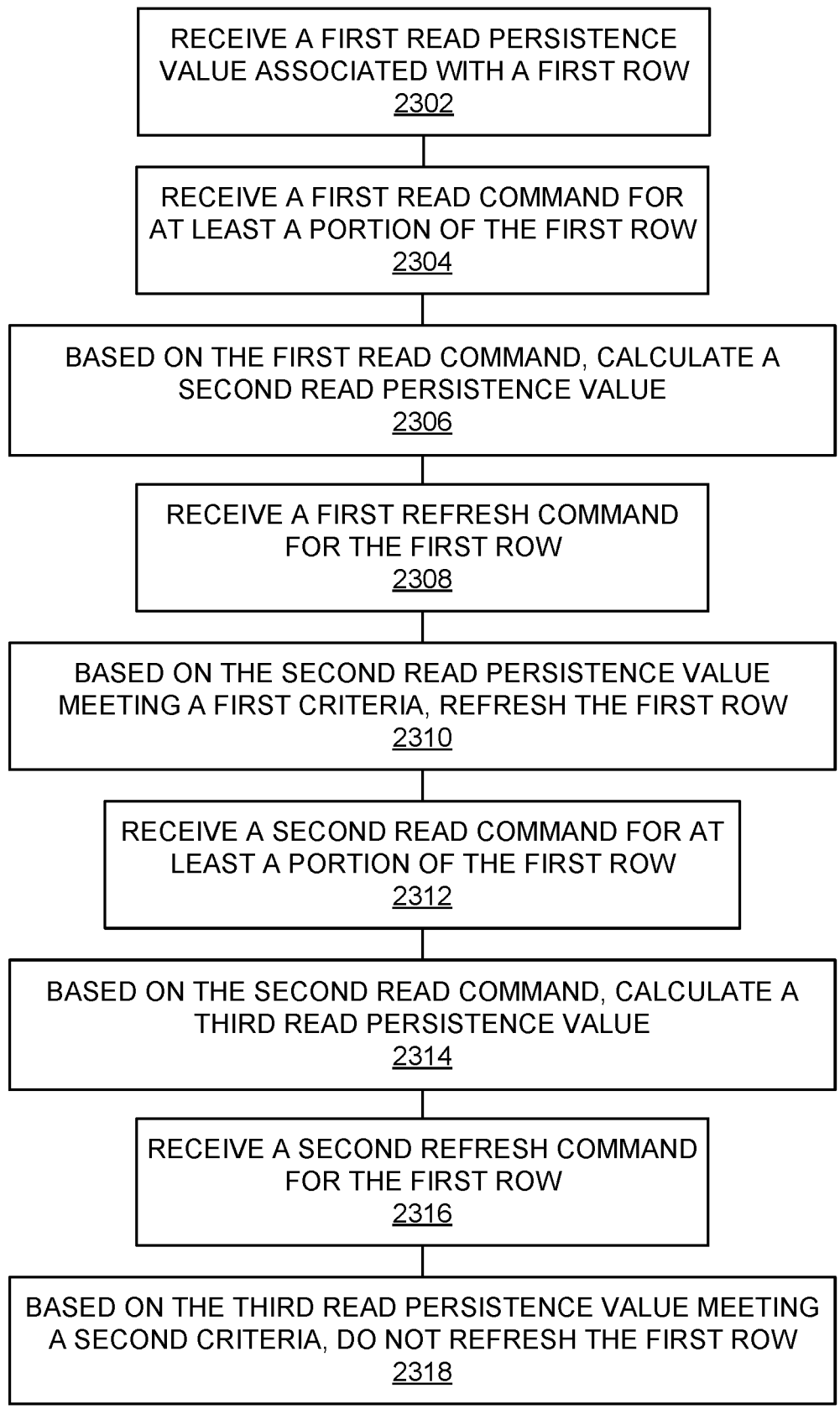

FIG. 23 is a flowchart illustrating example operations for reduced data persistence. One or more steps illustrated in FIG. 23 may be performed by, for example, memory system 1900 and/or its components. A first read persistence value associated with a first row is received (2302). For example, controller 1910 may write a first value into row mask register 1973 of memory component 1920 that indicates row 3 1943 may be read two (2) times before refreshing of row 3 1943 will stop.

A first read command for at least a portion of the first row is received (2304). For example, controller 1910 may issue a read command to memory component 1920 for data that is stored in row 3 1943. Based on the first read command a second read persistence value is calculated (2306). For example, based on receiving a read command for the data stored in row 3 1943, memory component 1920 may decrement the value in row mask register 3 1973 from two to one.

A first refresh command for the first row is received (2308). For example, when row 3 1943 is designated as the next row to be refreshed by refresh control circuitry 1950, controller 1910 may send a refresh command to memory component 1920 via interface 1915 and interface 1925. Based on the second read persistence value meeting a first criteria, the first row is refreshed (2310). For example, based on the value in row mask register 3 1973 being non-zero, memory component 1920 may refresh row 3 1943.

A second read command for at least a portion of the first row is received (2312). For example, controller 1910 may issue a read command to memory component 1920 for different (or the same) data that is stored in row 3 1943. Based on the second read command a third read persistence value is calculated (2314). For example, based on receiving a read command for data stored in row 3 1943, memory component 1920 may decrement the value in row mask register 3 1973 from one to zero.

A second refresh command for the first row is received (2316). For example, when row 3 1943 is designated as the next row to be refreshed by refresh control circuitry 1950, controller 1910 may send a refresh command to memory component 1920 via interface 1915 and interface 1925. Based on the third read persistence value meeting a first criteria, the first row is not refreshed (2318). For example, based on the value in row mask register 3 1973 being zero, memory component 1920 may skip the refresh of row 3 1943.

Figure 24:
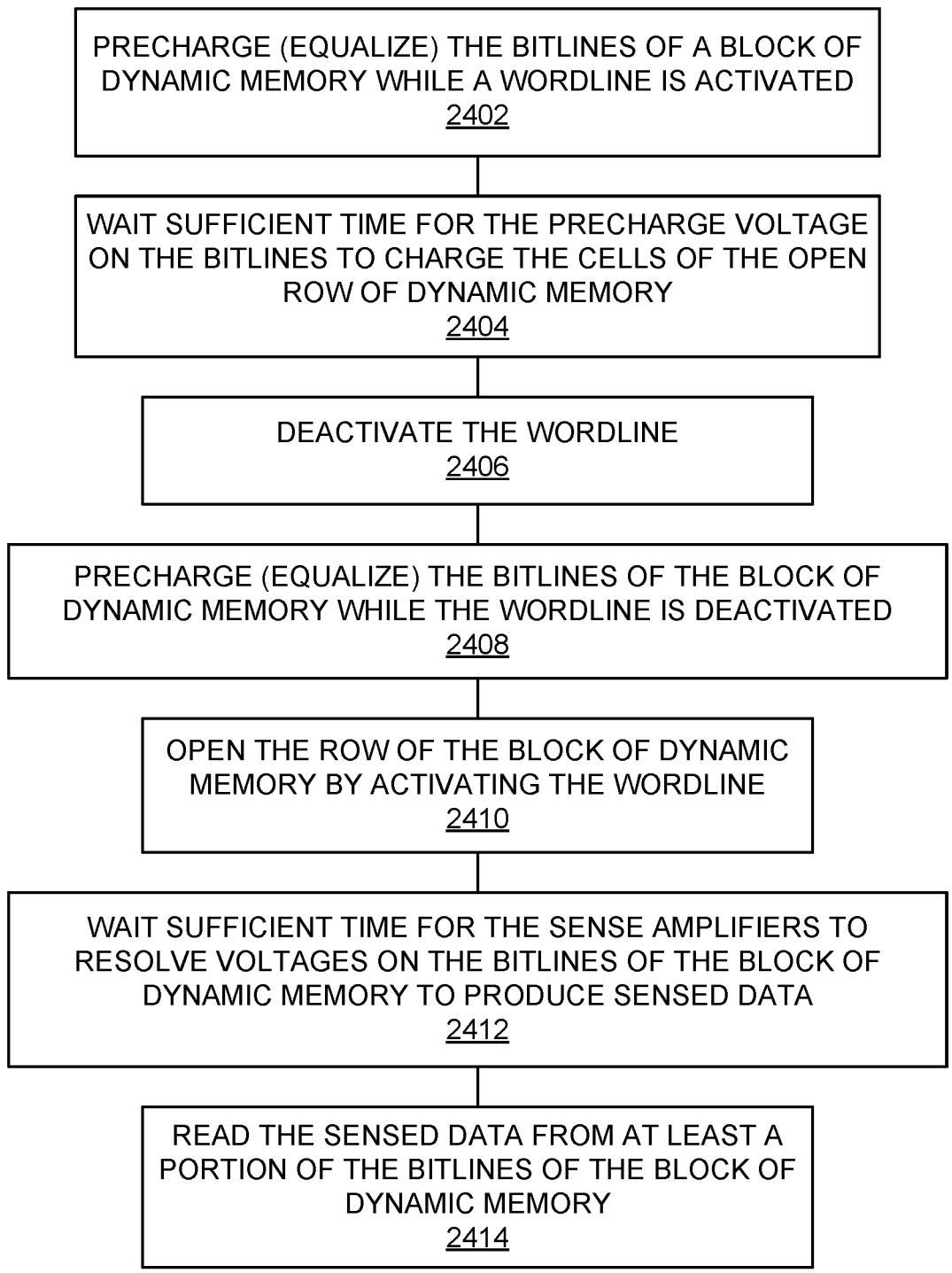
FIGS. 24-25 are flowcharts illustrating example data generation operations.

FIG. 24 is a flowchart illustrating an example data generation operation. One or more steps illustrated in FIG. 24 may be performed by, for example, memory system 500 and/or its components. The bitlines of a block of dynamic memory are precharged while a wordline is activated (2402). For example, while a wordline 562 is driven to $V_{PP,int}$, the bitlines 571-573 of the open row may be driven by sense amplifiers 530. A sufficient time is waited for the precharge voltage on the bitlines to charge the cells of the open row of dynamic memory (2404). For example, while the wordline 562 is held at $V_{PP,int}$, the bitlines 571-573 and the cells 552a-552c of the open row may be driven to VBLEQ by sense amplifiers 530 thereby erasing the information in sense amplifiers 530 and the cells 552a-552c of the open row.

The wordline is deactivated (2406). For example, wordline 562 may be driven to a negative supply voltage level (e.g., $V_{SS}$) thereby switching the transistors of cells 552a-552c to a non-conducting state. The bitlines of a block of dynamic memory are precharged while the wordline is deactivated (2408). For example, while the wordline 562 is driven to $V_{SS}$, the bitlines 571-573 may be driven by sense amplifiers 530 to VBLEQ. The row of the block of dynamic memory is opened by activating the wordline (2410). For example, wordline 562 may be driven to $V_{PP,int}$ thereby switching the transistors of cells 552a-552c to a conducting state.

A sufficient time is waited for the sense amplifiers to resolve voltages on the bitlines of the block of dynamic memory to produce sensed data (2412). For example, the cross-coupled inverters of sense amplifiers 530 evaluate the voltage difference on the bitlines 571-573 feeding back with each other to drive the bitlines 571-573 according to the voltage difference on the bitlines 571-573 thereby producing sensed data from the cells 552a-552c that were charged to VBLEQ. The sensed data is read from at least a portion of the bitlines of the block of dynamic memory (2414). For example, controller 520 may read data from one or more of sense amplifiers 530. In an embodiment, the data read from the sense amplifiers 530 may be used as a source for random number generation. In another embodiment, the data read from the sense amplifiers 530 may be output via interface 515 to be used as a physically unclonable function.

Figure 25:
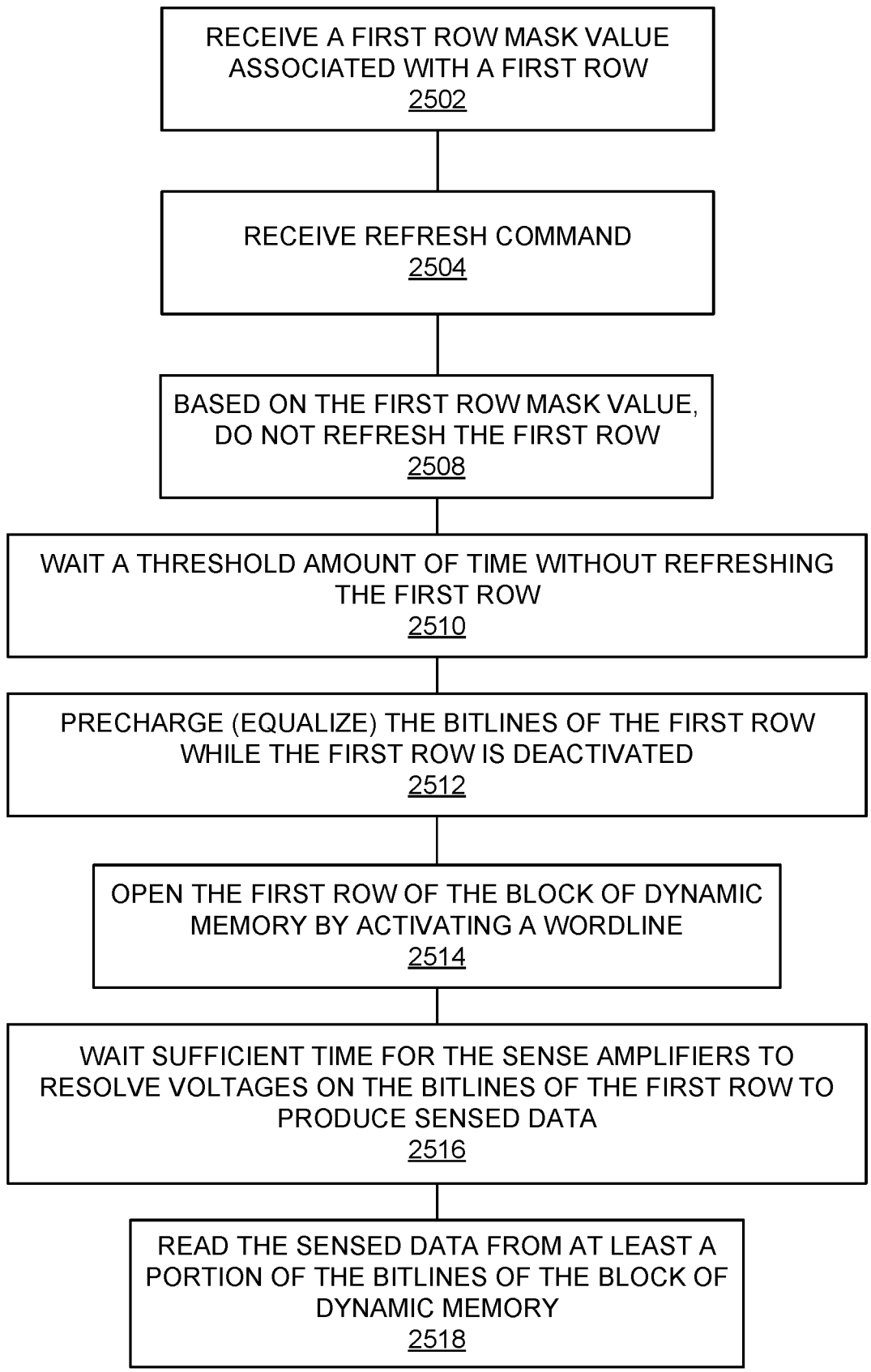

FIG. 25 is a flowchart illustrating an example data generation operation. One or more steps illustrated in FIG. 25 may be performed by, for example, memory system 1900 and/or its components. A first row mask value associated with a first row is received (2502). For example, controller 1910 may write a first value into row mask register 1973 of memory component 1920 that indicates row 3 1943 is not to be refreshed.

A refresh command is received (2504). For example, controller 1910 may send a refresh command to memory component 1920 via interface 1915 and interface 1925. Based on the first row mask value, the first row is not refreshed. For example, in response to the refresh command, memory component 1920, and based on the value in refresh mask register 1943, memory component 1920 may select a different row to be refreshed in response to the refresh command from controller 1910.

A threshold amount of time is waited without refreshing the first row (2510). For example, after writing the first row mask value, controller 1910 may wait a period of time to allow the voltages on the cells of row 3 1943 to decay. The bitlines of a block of dynamic memory are precharged while the wordline is deactivated (2512). For example, while the wordline of row 3 1943 is driven to $V_{SS}$, the bitlines of memory bank 1930 may be driven by sense amplifiers to VBLEQ. The row of the block of dynamic memory is opened by activating the wordline (2514). For example, wordline of row 3 1943 may be driven to $V_{PP,int}$ thereby switching the transistors of the cells in row 3 1943 to a conducting state.

A sufficient time is waited for the sense amplifiers to resolve voltages on the bitlines of the block of dynamic memory to produce sensed data (2516). For example, the cross-coupled inverters of the sense amplifiers evaluate the voltage difference on the bitlines of row 3 1943 feeding back with each other to drive the bitlines according to the voltage difference on the bitlines thereby producing sensed data from the cells of row 3 1943 that were allowed to decay longer than the guaranteed retention time (e.g., 32 ms). The sensed data is read from at least a portion of the bitlines of the block of dynamic memory (2518). For example, controller 1910 may read data from one or more of sense amplifiers connected to row 3 1943. In an embodiment, the data read from the sense amplifiers may output via interface 1925 be used as a source for random number generation. In another embodiment, the data read from the sense amplifiers may be output via interface 1925 to be used as a physically unclonable function.

In some embodiments, memory system 100, memory system 500, memory system 1900, and/or memory system 2000 may also include circuitry described with reference to the other memory systems 100, 500, 1900, and/or 2000; and/or be implemented and/or configured to perform one or more, or all, of the functions described herein with reference to FIGS. 1-25.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, memory system 500, memory system 1900, and/or memory system 2000, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 26:
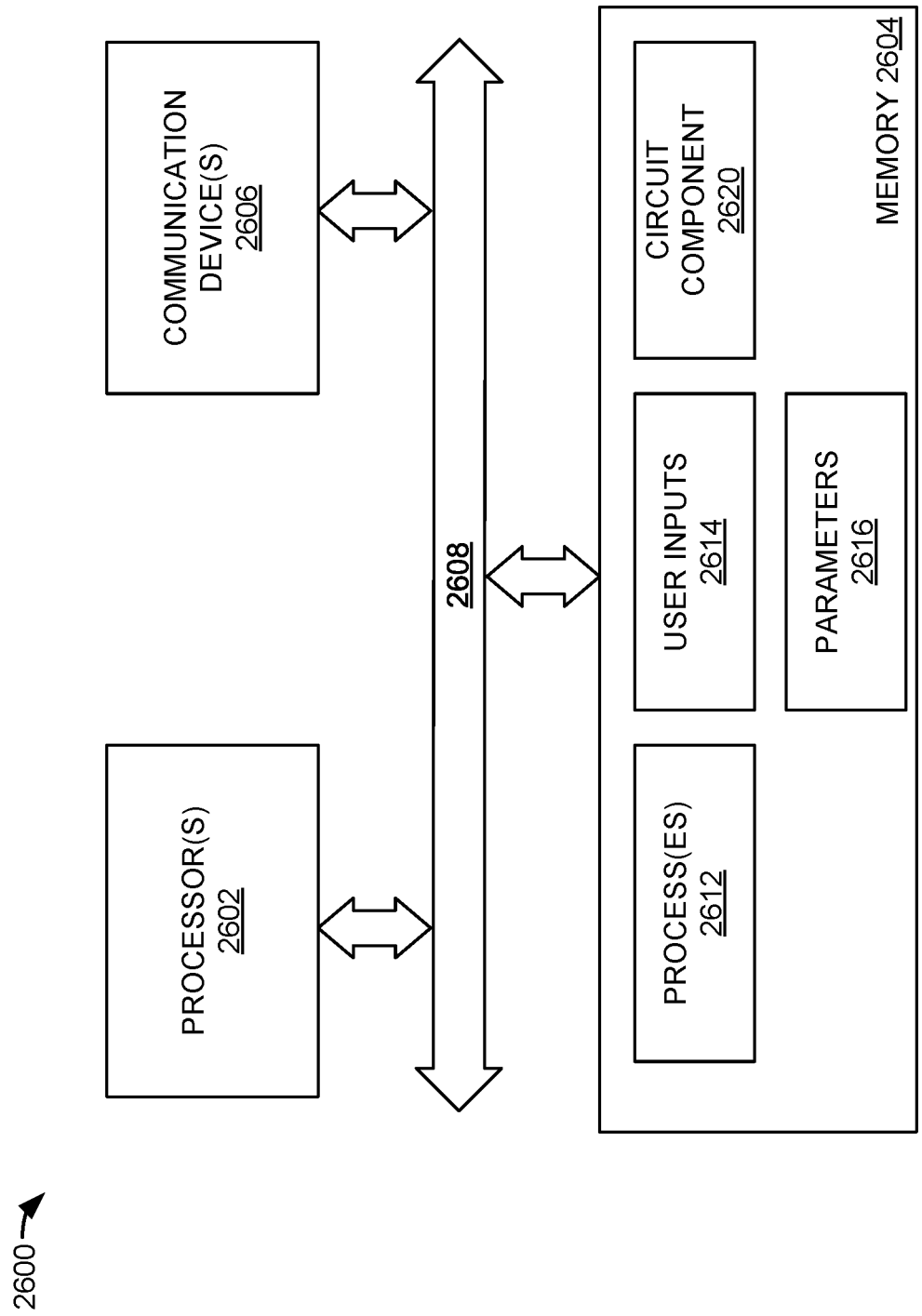
FIG. 26 is a block diagram illustrating a processing system.

FIG. 26 is a block diagram illustrating one embodiment of a processing system 2600 for including, processing, or generating, a representation of a circuit component 2620. Processing system 2600 includes one or more processors 2602, a memory 2604, and one or more communications devices 2606. Processors 2602, memory 2604, and communications devices 2606 communicate using any suitable type, number, and/or configuration of wired and/or wireless connections 2608.

Processors 2602 execute instructions of one or more processes 2612 stored in a memory 2604 to process and/or generate circuit component 2620 responsive to user inputs 2614 and parameters 2616. Processes 2612 may be any suitable electronic design automation (EDA) tool or portion thereof used to design, simulate, analyze, and/or verify electronic circuitry and/or generate photomasks for electronic circuitry. Representation 2620 includes data that describes all or portions of memory system 100, memory system 500, memory system 1900, and/or memory system 2000, and their components, as shown in the Figures.

Representation 2620 may include one or more of behavioral, register transfer, logic component, transistor, and layout geometry-level descriptions. Moreover, representation 2620 may be stored on storage media or communicated by carrier waves.

Data formats in which representation 2620 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 2614 may comprise input parameters from a keyboard, mouse, voice recognition interface, microphone and speakers, graphical display, touch screen, or other type of user interface device. This user interface may be distributed among multiple interface devices. Parameters 2616 may include specifications and/or characteristics that are input to help define representation 2620. For example, parameters 2616 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 2604 includes any suitable type, number, and/or configuration of non-transitory computer-readable storage media that stores processes 2612, user inputs 2614, parameters 2616, and circuit component 2620.

Communications devices 2606 include any suitable type, number, and/or configuration of wired and/or wireless devices that transmit information from processing system 2600 to another processing or storage system (not shown) and/or receive information from another processing or storage system (not shown). For example, communications devices 2606 may transmit circuit component 2620 to another system. Communications devices 2606 may receive processes 2612, user inputs 2614, parameters 2616, and/or circuit component 2620 and cause processes 2612, user inputs 2614, parameters 2616, and/or circuit component 2620 to be stored in memory 2604.

Implementations discussed herein include, but are not limited to, the following examples:

Example 1: A dynamic random access memory (DRAM) device, comprising: an interface to receive, from an external device, a command to erase a block of memory cells, the block of memory cells coupled to a plurality of wordlines and a plurality of bitlines of a memory array; and, circuitry to, in response to the command, erase the block of memory cells by activating all of the wordlines of the plurality of wordlines concurrently.

Example 2: The DRAM device of example 1, wherein each memory cell of the block of memory cells is coupled to a respective one of the plurality of wordlines and a respective one of the plurality of bitlines, and a concurrent activation of the plurality of wordlines is to share, with a first bitline, a plurality of charges held by a plurality of memory cells respectively coupled to the plurality of wordlines and the first bitline.

Example 3: The DRAM device of example 1, wherein the block of memory cells to be activated by a concurrent activation of the plurality of wordlines comprise all memory cells coupled to the plurality of bitlines.

Example 4: The DRAM device of example 2, wherein the plurality of bitlines are each coupled to a respective one of a plurality of sense amplifier circuits, a first sense amplifier circuit of the plurality of sense amplifier circuits to amplify a voltage difference that results from a sharing, with the first bitline, the plurality of charges held by the plurality of memory cells.

Example 5: The DRAM device of example 4, wherein the first sense amplifier circuit is to amplify the voltage difference to a writeback voltage that is written to each of the plurality of memory cells.

Example 6: The DRAM device of example 1, further comprising: a refresh mask register to indicate at least one row that is not to be refreshed; and, refresh control circuitry to, based on a value in the refresh mask register, skip refresh of the at least one row.

Example 7: The DRAM device of example 1, wherein a plurality of sense amplifiers coupled to the plurality of bitlines of the memory array is read while the plurality of wordlines are concurrently activated to receive a random number value and the random number value is output via a data interface.

Example 8: A dynamic random access memory (DRAM) device, comprising: a memory array having a plurality of memory cells coupled to a respective plurality of bitlines; an interface to receive, from an external device, a first command to erase data stored in a row of the memory array, wherein the row has been activated to hold the data in a plurality of sense amplifiers; and, circuitry to, in response to the first command, control the plurality of sense amplifiers to equalize the plurality of sense amplifiers while the row remains activated.

Example 9: The DRAM device of example 8, wherein, after the plurality of sense amplifiers are controlled to equalize the plurality of sense amplifiers while the row remains activated, the row is controlled to be deactivated.

Example 10: The DRAM device of example 9, wherein controlling the row to be deactivated while the plurality of sense amplifiers are being controlled to equalize writes an equalization voltage to the plurality of memory cells of the row.

Example 11: The DRAM device of example 10, wherein, after the row is controlled to be deactivated, the row and the sense amplifiers are controlled to read the row before the row and the sense amplifiers are controlled to write the row.

Example 12: The DRAM device of example 8, wherein the DRAM has a first command to command delay interval for a first type of successive command after the first command, and has a second command to command delay interval for the first type of successive command after a second command.

Example 13: The DRAM device of example 12, wherein the first command to command delay interval and the second command to command delay interval are equivalent.

Example 14: The DRAM device of claim 8, wherein the DRAM has a first command to command delay interval for a first type of successive command after the first command, and has a second command to command delay interval for a second type of successive command after a second command.

Example 15: A dynamic random access memory (DRAM) device, comprising: trigger circuitry to receive an indicator to initiate erasing memory cells of a memory array, the memory array comprised of a plurality of subarrays of memory cells each coupled to a respective plurality of wordlines and a respective plurality of bitlines; and, circuitry to, in response to the indicator, and for each of the plurality of subarrays, activate the respective plurality of wordlines concurrently with each other of the respective plurality of wordlines.

Example 16: The DRAM device of example 15, wherein the respective plurality of wordlines of the respective one of the plurality of subarrays are activated concurrently with a respective plurality of wordlines of at least one other of the plurality of subarrays.

Example 17: The DRAM device of example 15, wherein the indicator comprises a trigger signal received from a device external to the DRAM device.

Example 18: The DRAM device of example 15, wherein the indicator comprises a sequence of commands received from a device external to the DRAM device.

Example 19: The DRAM device of example 15, wherein the indicator is sent to the trigger circuitry in response to a detection of a rapid cooling event.

Example 20: The DRAM device of example 15, wherein the indicator is sent to the trigger circuitry in response to a detection of that power to the DRAM device is being lost.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory module, comprising:
a first integrated circuit to detect a secure shutdown event and to provide an indicator of the secure shutdown event;
a plurality of memory components comprising blocks of memory cells, a first memory component of the plurality of memory components comprising a first sense amplifier circuit and a first block of memory cells, the first block of memory cells coupled to a plurality of wordlines and a plurality of bitlines of a memory array, the plurality of bitlines including a first bitline coupled to a plurality of memory cells respectively coupled to the plurality of wordlines and the first bitline;
the first memory component to, based on the indicator of the secure shutdown event, erase the block of memory cells by causing activations of the plurality of wordlines of the first block of memory cells to occur concurrently, concurrent activation of the plurality of wordlines to cause a sharing, with the first bitline, of a plurality of charges held by the plurality of memory cells; and
the first sense amplifier circuit is to amplify a voltage difference resulting from the sharing of the plurality of charges held by the plurality of memory cells to a writeback voltage that is written to each of the plurality of memory cells.

2. The memory module of claim 1, wherein the first integrated circuit comprises power management circuitry and the secure shutdown event is based on a power loss condition.

3. The memory module of claim 1, wherein the first integrated circuit comprises serial presence detect circuitry and the secure shutdown event is based on an anomalous temperature condition.

4. The memory module of claim 3, wherein the anomalous temperature condition is based on a detection of a rapid cooling.

5. The memory module of claim 1, further comprising:
a registering clock driver (RCD) integrated circuit to receive the indicator of the secure shutdown event.

6. The memory module of claim 5, wherein the RCD integrated circuit issues at least one command to initiate the erase of the respective blocks of memory cells by the plurality of memory components.

7. The memory module of claim 1, wherein the indicator of the secure shutdown event is conveyed via a wired-OR signal coupled to the first integrated circuit.

8. A memory module, comprising:
a plurality of memory components, each respectively having:
a memory array having a plurality of memory cells coupled to a respective plurality of bitlines,
an interface to receive a first indicator to erase data stored in a plurality of rows of the memory array that are activated by a plurality of wordlines, and
circuitry to, in response to the first indicator, control a plurality of sense amplifiers to concurrently equalize the plurality of sense amplifiers concurrently with the plurality of wordlines concurrently activating the plurality of rows; and a first integrated circuit to detect a secure shutdown event and to provide an indicator of the secure shutdown event to the plurality of memory components.

9. The memory module of claim 8, wherein the indicator of the secure shutdown event comprises a command to be received by respective command/address interfaces of the plurality of memory components.

10. The memory module of claim 8, wherein the first integrated circuit comprises power management circuitry and the secure shutdown event is based on a power loss condition.

11. The memory module of claim 8, wherein the first integrated circuit comprises serial presence detect circuitry and the secure shutdown event is based on an anomalous temperature condition.

12. The memory module of claim 11, wherein the anomalous temperature condition is based on a detection of a rapid cooling.

13. The memory module of claim 8, wherein the first integrated circuit is a registering clock driver (RCD) integrated circuit.

14. The memory module of claim 13, wherein the first integrated circuit issues at least two commands to initiate the erase of respective rows of memory cells by the plurality of memory components.

15. The memory module of claim 8, wherein the indicator of the secure shutdown event is conveyed via a wired-OR signal coupled to the plurality of memory components.

16. A method of operation of a memory module, the method comprising:

detecting a secure shutdown event;

providing an indicator of the secure shutdown event to a plurality of memory components on the memory module; and based on the indicator of the secure shutdown event, erasing, by at least a first memory component of the plurality of memory components, a block of memory cells that are activated by a plurality of wordlines and sensed via a plurality of bitlines by concurrently activating the plurality of wordlines of the block of memory cells concurrently with equalizing the plurality of bitlines of the block of memory cells.

17. The method of claim 16, wherein power management circuitry detects the secure shutdown event.

18. The method of claim 17, wherein the secure shutdown event comprises a power loss condition.

19. The method of claim 16, wherein serial presence detect circuitry detects the secure shutdown event.

20. The method of claim 19, wherein the secure shutdown event comprises an anomalous temperature condition.

* * * * *